(12) United States Patent
Vivoli et al.

(10) Patent No.: US 11,501,197 B2
(45) Date of Patent: Nov. 15, 2022

(54) SYSTEMS AND METHODS FOR QUANTUM COMPUTING BASED SAMPLE ANALYSIS

(71) Applicant: FEI Company, Hillsboro, OR (US)

(72) Inventors: Valentina Caprara Vivoli, Eindhoven (NL); Yuchen Deng, Eindhoven (NL); Erik Michiel Franken, Eindhoven (NL)

(73) Assignee: FEI Company, Hillsboro, OR (US)

( * ) Notice: Subject to any disclaimer, the term of this patent is extended or adjusted under 35 U.S.C. 154(b) by 728 days.

(21) Appl. No.: 16/542,199

(22) Filed: Aug. 15, 2019

(65) Prior Publication Data

US 2021/0049493 A1  Feb. 18, 2021

(51) Int. Cl.
| | | |
|---|---|---|
| G06N 10/00 | (2022.01) | |
| G06F 17/14 | (2006.01) | |
| G06F 17/15 | (2006.01) | |
| H03K 19/195 | (2006.01) | |
| G06V 10/75 | (2022.01) | |

(52) U.S. Cl.
CPC .......... *G06N 10/00* (2019.01); *G06F 17/14* (2013.01); *G06F 17/15* (2013.01); *G06V 10/751* (2022.01); *H03K 19/195* (2013.01)

(58) Field of Classification Search
CPC ........ G06N 10/00; G06N 10/20; G06N 10/40; G06N 10/60; G06N 10/70; G06N 10/80; G06V 10/751; G06F 17/14; G06F 17/15; H03K 19/195
See application file for complete search history.

(56) References Cited

PUBLICATIONS

Lomont, Chris. "Quantum convolution and quantum correlation algorithms are physically impossible." arXiv preprint quant-ph/0309070 (2003). (Year: 2003).*
"Quantum Algorithms for Convolution". Stack Exchange. https://quantumcomputing.stackexchange.com/questions/3980/quantum-algorithms-for-convolution. Accessed Jun. 28, 2022. Question asked Aug. 8, 2018. (Year: 2018).*
Brassard, Gilles, et al. "Quantum amplitude amplification and estimation." Contemporary Mathematics 305 (2002): 53-74. (Year: 2002).*

* cited by examiner

*Primary Examiner* — Li B. Zhen
*Assistant Examiner* — Markus A. Vasquez

(57) ABSTRACT

Methods and systems for quantum computing based sample analysis include computing cross-correlations of two images using a quantum processing system, and computing less noisy image based of two or more images using a quantum processing system. Specifically, the disclosure includes methods and systems for utilizing a quantum computing system to compute and store cross correlation values for two sets of data, which was previously believed to be physically impossible. Additionally, the disclosure also includes methods and systems for utilizing a quantum computing system to generate less noisy data sets using a quantum expectation maximization maximum likelihood (EMML). Specifically, the disclosed systems and methods allow for the generation of less noisy data sets by utilizing the special traits of quantum computers, the systems and methods disclosed herein represent a drastic improvement in efficiency over current systems and methods that rely on traditional computing systems.

19 Claims, 6 Drawing Sheets

SYSTEMS AND METHODS FOR QUANTUM COMPUTING BASED SAMPLE ANALYSIS

BACKGROUND OF THE INVENTION

Cross correlation is a widely used technique for estimating the degree to which two data sets are similar as a function of certain parameters. Examples of current applications of cross correlation include pattern recognition, single particle analysis, electron tomography, signal detection, cryptanalysis, and neurophysiology. Cross correlation techniques are helpful in these applications at least in part because they reduce the complexity of constituent computations, thus providing a computational speed up that improves computing efficiency while reducing the time necessary to obtain results. For example, when fast Fourier transforms (FFT) are used, the complexity of the correlation calculation reduces from $O(N^2)$ to $O(N \log N)$.

This speedup is especially valuable in technical fields such as image processing for optical and charged particle systems which, even with the use of current cross correlation techniques, may still require hundreds of hours of computations to measure shifts between images and/or particles. Additionally, as new generations of charged particle systems continue to improve upon the resolution and efficiency of previous generations, the amount of data generated by charged particle systems will continue to increase. Accordingly, it is desired to find new techniques to improve these processes.

Another widely used technique is expectation maximization maximum likelihood (EMML), in which an iterative algorithm is used to find maximum likelihood parameters of a statistical model in cases where the equations cannot be solved directly. For example, the EMML algorithm can be applied to a number of noisy images of a subject to generate a less noisy image of the subject. However, EMML algorithms require large amounts of computing resources when processing data in two or more dimensions. Therefore, it is desired to find more computationally efficient ways to use EMML.

One avenue being investigated to improve these and similar processes is the field of quantum computing. By enabling the storage and computation of data in superposition, quantum computing systems offer a potential to provide a drastic speed up over current computing systems. Unfortunately, it is currently believed that correlations cannot be calculated through quantum computing. This is partially because known processes for computing cross correlations have been shown to be physically impossible to perform within a quantum computing system. Accordingly, there is a need for new methods and systems to enable the computation of cross correlations within quantum computing systems.

SUMMARY OF THE INVENTION

Methods and systems for quantum computing based sample analysis includes computing cross-correlations of two images using a quantum processing system, and computing less noisy images based of two images using a quantum processing system. Computing cross-correlations of two images using a quantum processing system includes importing first image data and second image data into a quantum circuit that comprises a first set of qubits configured to receive the first image data, a second set of qubits configured to receive the second image data, a third set of qubits configured to store shift values, and a fourth set of qubits where a cross-correlation function is calculated. A quantum amplitude estimation (QAE) is then implemented between the first three sets of qubits and the fourth set of qubits, and correlation values for the image data are determined based at least in part on one or more shift values in the third set of qubits. A new image may then be generated based at least in part on the first image data, the second image data, and the cross-correlation values.

Computing less noisy images based of two images using a quantum processing system includes importing an image data array into a quantum circuit that comprises a first set of qubits configured to store a template image data array, a second set of qubits configured to receive the data image array, a third set of qubits configured to receive the data image array. and a fourth set of qubits where a new data image value is to be written. A QAE is then implemented between the first three sets of qubits and the fourth set of qubits, and then a new value in EMML for the image data array is determined based at least in part on the new image data value in the fourth set of qubits. A new, less noisy, data image may then be generated based at least in part on the image data array and the new value in EMML for the image data array.

BRIEF DESCRIPTION OF THE DRAWINGS

The detailed description is described with reference to the accompanying figures. In the figures, the left-most digit(s) of a reference number identify the figure in which the reference number first appears. The same reference numbers in different figures indicates similar or identical items.

Figure 1:
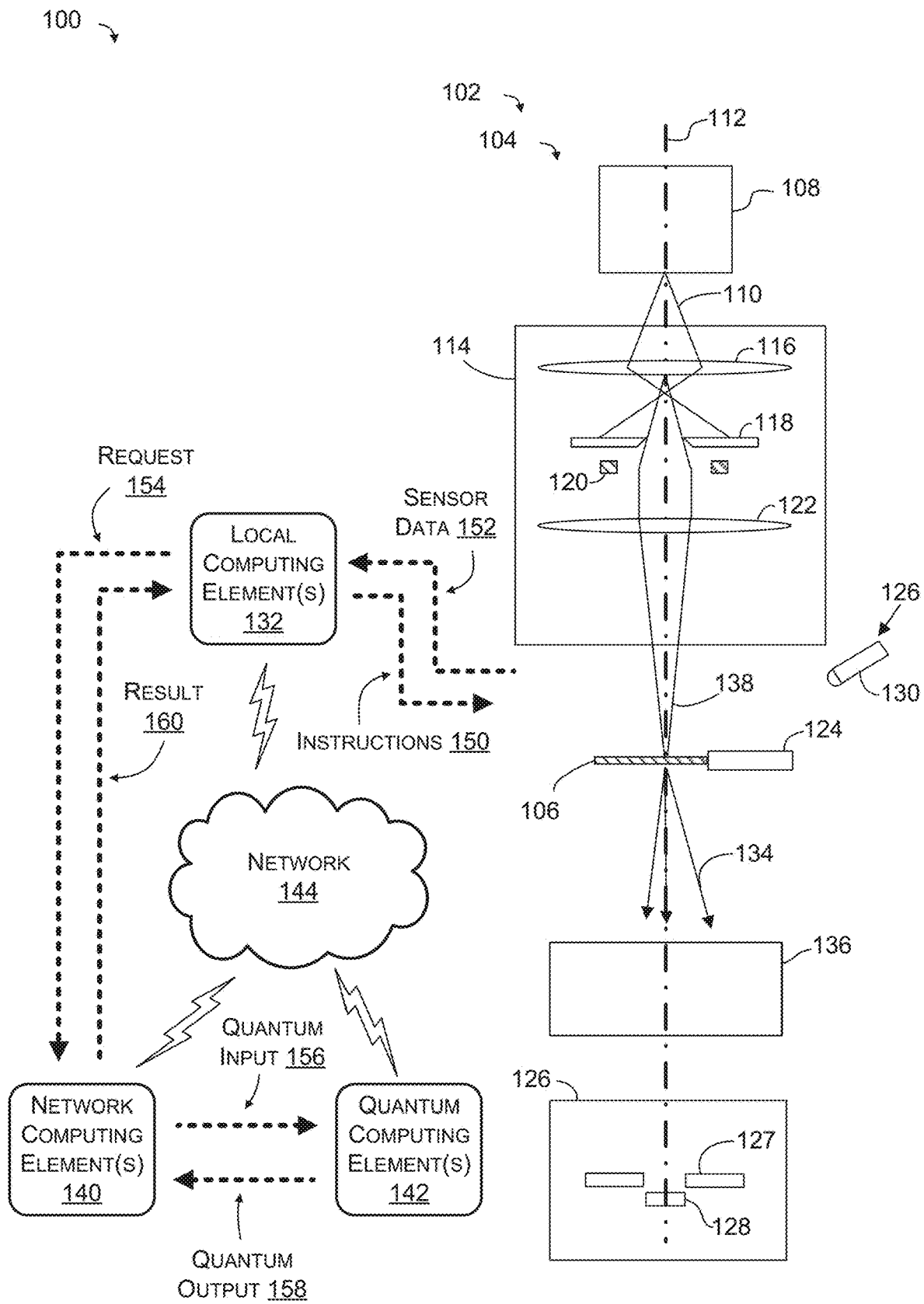
FIG. 1 illustrates an example environment for quantum computing based sample analysis.

Like reference numerals refer to corresponding parts throughout the several views of the drawings. Generally, in the figures, elements that are likely to be included in a given example are illustrated in solid lines, while elements that are optional to a given example are illustrated in broken lines. However, elements that are illustrated in solid lines are not essential to all examples of the present disclosure, and an element shown in solid lines may be omitted from a particular example without departing from the scope of the present disclosure.

DETAILED DESCRIPTION OF EMBODIMENTS

Methods and systems for quantum computing based sample analysis are disclosed. More specifically, the disclosure includes methods and systems for utilizing a quantum computing system to compute and store cross correlation values for two sets of data, which was previously believed to be physically impossible. The disclosed systems and methods combine the complexity reduction resultant from cross correlation techniques with the computational speedups inherent to quantum computing. In this way, the disclosed systems and methods can result in a quadratic speedup of cross correlation value computations, which can allow for larger quantities of data to be processed more quickly. Example applications of this innovation can include using the quantum computing system to compute and store cross correlation values between two images, such as images captured with a charged particle microscope, which may then be used to generate an image.

Additionally, the disclosure also includes methods and systems for utilizing a quantum computing system to generate less noisy data sets using a quantum expectation maximization maximum likelihood (EMML) algorithm. Specifically, the disclosed systems and methods allow for the generation of less noisy data sets in a much more computationally efficient way. That is, by utilizing the special traits of quantum computers, the systems and methods disclosed herein represent a drastic improvement in efficiency over current systems and methods that rely on traditional computing systems. Example applications of this innovation can include using the quantum EMML in a quantum computing system to generate a less noisy image of a subject from two or more noisy images of the subject.

FIG. 1 is an illustration of example quantum computing environment(s) 100 for quantum computing based sample analysis. Specifically, FIG. 1 shows example quantum computing environment(s) 100 for generating images from a microscope system 102 by leveraging cross correlation techniques in combination with quantum computing capabilities to drastically reduce the time required to process multiple sets of image data, and/or generating less noisy images of a sample 106 by applying a quantum EMML algorithm to two or more images of the sample 106 captured by the microscope system 102.

However, this is only an illustration of a particular application of the disclosed methods and systems disclosed herein, and the methods and system may be used to combine the complexity reduction of cross correlation/quantum EMML techniques and the computational speedups of quantum computing to achieve a reduction in computation requirements to achieve other results, such as but not limited to, pattern recognition, single particle analysis, signal detection, cryptanalysis, and neurophysiology. The microscope system 102 may be or include one or more different types of optical, and/or charged particle microscopes, such as, but not limited to, a scanning electron microscope (SEM), a scanning transmission electron microscope (STEM), a transmission electron microscope (TEM), a charged particle microscope (CPM), dual beam microscopy system, etc.

FIG. 1 shows the microscope system 102 as being a STEM system 104 for generating images of a sample 106. However, a person having skill in the art would understand from FIG. 1 how the methods and system of the present disclosure would be embodied with other types of microscope system 102 and/or other sensor systems. The STEM system 104 includes an electron source 108 that emits an electron beam 110 along an emission axis 112, towards a focusing column 114. In some embodiments, the focusing column 114 may include one or more of a condenser lens 116, aperture 118, scan coils 120, and upper objective lens 122. The focusing column 114 focuses electrons from electron source 108 into a small spot on sample 106. Different locations of the sample may be scanned by adjusting the electron beam 110 direction via the scan coils 120. For example, by operating scan coils 120, electron beam 110 may be shifted focus onto different locations of sample 106. The sample 106 may be a biological sample (e.g., one or more cells, microorganisms, biopsy samples, etc.) or a non-biological sample (e.g., a mineral sample, a metal sample, a crystal sample, a semiconductor wafer, etc.). The sample 106 may be thin enough to not impede the transmission of most of the electrons in the electron beam 110. The sample 106 may be held by a sample holder 124.

STEM system 104 may include one or more sensor systems 126. For example, FIG. 1 illustrates the STEM system 104 as including both a disk-shaped bright field detector 127, a dark field detector 128, and an X-ray sensor 130. In such embodiments, STEM system 104 may simultaneously detect signals from one or more of the bright field detector 126, the dark field detector 128, and/or the X-ray sensor 130. Alternatively, or in addition, the one or more sensor systems 126 may include a scanning electron microscope sensor system, a focused ion beam sensor system, a scanning electron microscope secondary electron sensor system, a focused ion beam secondary electron sensor system, and an optical microscope sensor system, a high angle dark field sensor system, a dispersion x-ray sensor system, a back scatter sensor system, an electron energy loss spectroscopy sensor system, a secondary ion sensor system, and a secondary ion mass spectroscopy sensor system. Signals from the one or more sensor systems 126 may be amplified and sent to the computing element(s) 132.

As shown in FIG. 1, electrons 134 passing through sample 106 may enter projector 136. In one embodiment, the projector 136 may be a separate part from the focusing column 114. In another embodiment, the projector 136 may be an extension of the lens field from a lens in focusing column 114. The projector 136 may be adjusted so that the electrons 134 passing through the sample 106, impinge on the one or more of the sensor systems 126.

FIG. 1 illustrates example quantum computing environment(s) 100 as including one or more local computing element(s) 132. In various embodiments, local computing elements 132 may be a component of the microscope system 102 may be in communication with the microscope system 102 via a local/network communication interface, or a combination thereof. For example, quantum computing environment(s) 100 may include a local computing element 132 that is a component portion of the microscope system 102, which acts as a controller that transmits instructions 150 that drive the operation of the microscope system 102 (e.g., adjust the scanning location on the sample 106 by operating the scan coils 120, adjust the profile of the incident beam 138 by adjusting one or more apertures and/or lens, adjust the sample orientation relative to the incident beam 138 by adjusting the sample holder 124, etc.). Alternatively or in addition, the example quantum computing environment(s) 100 may include a local computing element 132 separate from and in wired and/or wireless communication with the microscope system 102, which receives and processes sensor data 152 obtained by the one or more sensors 126.

The local computing element(s) 132 are further illustrated as being in communication with one or more network computing element(s) 140 and/or quantum computing element(s) 142 over a network 144. The network 144 may be a local communication network (e.g., LAN), or a wide area communication network (e.g., the internet). The local computing element(s) 132 are executable to receive the sensor data 152 from sensors 126 and/or user input from one or more operators associated with the local computing elements 132, and to transmit a request 154 to the network computing element(s) 142. The request 154 may be transmitted via an application programming interface API that enables communication between local computing element(s) 132 and network computing element(s) 140. The request may include portions of the sensor data 152, one or more identifiers (e.g., a security key, a password, a user ID, a device ID, an encryption key, or other data constructs configured to identify and/or validate the local computing elements 132), and/or one or more functions or procedures that trigger the network computing element 142 to perform a requested set of actions. For example, a request 154 may include a first array of image data that comprises pixel values of an image obtained via examination of sample 106 over a first period of time and a second array of image data that comprises pixel values of an image obtained via examination of sample 106 over a second period of time.

The network computing element(s) 140 may be executable to compute cross correlation values for a plurality of data arrays. Specifically, the network computing element(s) 140 may be executable to utilize one or more quantum computing elements 142 to compute cross correlation values for the plurality of data arrays. In some embodiments, the network computing element(s) 140 may be executable to compute cross correlation values between two sets of image data and then generate a combined image based on the cross correlation values. The network computing element(s) 140 are executable to convert the data included in the request 154 into a quantum input 156, and then input the quantum input 156 into the quantum element(s) 142. Generating a quantum input 156 may correspond to creating a computing construct that allows the data included in the request 154 to be received and/or processed by the quantum element(s) 142. For example, according to the present disclosure the data may be normalized so that each individual element ($x_j$) of the data is real, positive number. Additionally, while the present disclosure only discusses the computation of cross correlation functions and the EMML algorithm for real number arrays, the disclosure is not limited to such embodiments. Rather, a person having skill in the art would understand that the cross correlation functions disclosed herein supports the extension of these functions to complex number arrays. For example, in the case of complex numbers the cross-correlations are the result of the combination of four real-valued cross-correlations (i.e., the real and imaginary parts of the data arrays). Similarly, a person having skill in the art would also understand that disclosed embodiments of the EMML algorithm include the rearrangement of the EMML algorithm for the computation of complex data arrays. For example, such EMML algorithms for computation of complex data arrays can be derived from those presented by noticing that the real and imaginary parts of the new data arrays are given by sums of products of the real and imaginary parts of the initial data arrays The quantum element(s) 142 include one or more quantum gate processors, which may include one or more quantum circuits (i.e., models for quantum computation in which a computation is performed using a sequence of quantum logic gates) operating on a number of qubits (i.e., quantum bits) within the quantum element(s). In specific embodiments, the quantum element(s) 142 include a quantum circuit that comprises a plurality of quantum registers, where each quantum register comprises multiple qubits that can store data in quantum superposition. The plurality of quantum registers may include a first quantum register configured to receive first data, and a second quantum register configured to receive second data, a third quantum register configured to store shift values, and a fourth quantum register where the cross-correlation values for the first data and the second data are calculated. For example, where the quantum input 156 includes first image data for a first image and second image data for a second image, the first quantum register may be initialized to receive the first image data, and the second quantum register configured to receive the second image data.

The quantum element(s) 142 are configured so that a series of computational steps are performed on the quantum registers. For example, the quantum circuit may be configured to apply a $H^{\otimes \log N}$ gate to the third quantum register, and then apply a quantum amplitude estimation between the first quantum register, second quantum register, and third quantum register from one side, and the fourth quantum register on the other. The quantum element(s) 142 may be configured to perform a modified QAE in which a quantum Fourier transform (QFT) over the fourth quantum register, and then a controlled $Q^M \Lambda_M (Q)$ is applied on each of the first quantum register, second quantum register, third quantum register from one side, and the fourth quantum register. The operator Q uses the third register as an ancilla that helps for defining the constraints of the QAE, but stays untouched during the other steps. The quantum computing elements 142 then applies an inverse QFT on the fourth quantum register.

The network computing element(s) 140 may be executable to read out one or more quantum outputs 158 from the quantum computing element(s) 142. For example, the network computing element(s) 140 may be executable to read out the values of $\theta_j$. From the fourth quantum register, which the network computing element(s) 140 may then use to compute the cross correlation values associated with the first data and the second data received in the request 154.

Alternatively, or in addition, the network computing element(s) 140 may also be executable to generate a less noisy data set by applying a quantum EMML algorithm to two or more sets of data. Specifically, the network computing element(s) 140 may be executable to utilize the one or more quantum computing elements 142 to applying the quantum EMML algorithm to two or more images of the sample 106 captured by the microscope system 102, and to use the results to generate a less noisy image of the sample 106.

As discussed above, the quantum computing element(s) 142 include a plurality of quantum registers. In some embodiments, the plurality of quantum registers included in the quantum computing element(s) 142 may include a first quantum register configured to store a template array, a second quantum register and a third quantum register configured to receive a data array, and a fourth quantum register where a new data value is to be written. The data array is part of a set of two or more data arrays, and the template array corresponds to a set of values that are given by an average of the data of the set of data arrays. For example, where the microscope system 102 generates multiple images of sample 106, the quantum input 156 may include image data for one of the images (i.e., the data array), and a data array of the average pixel values across the multiple images generated by the microscope system 102 (i.e., the template array). In such an example, the second and third quantum registers may be initialized to receive the image data, and the first quantum register may be initialized to receive the data array of the average pixel values across the multiple images generated by the microscope system 102.

As discussed above, the quantum element(s) 142 are configured so that a series of computational steps are performed on the quantum registers. For example, the quantum circuit may be configured to apply a difference gate that implements a difference operation on the third quantum register, and/or apply a quantum estimation between the first quantum register, second quantum register, and third quantum register from one side, and the fourth quantum register on the other. The quantum element(s) 142 are configured to perform a modified quantum amplified estimation in which a QFT over the fourth quantum register, and then a controlled $G^M \Gamma_M(G)$ is applied to the first quantum register, the second quantum register, the third quantum register, and the fourth quantum register. The quantum computing elements 142 may then cause an inverse QFT to be applied on the fourth quantum register.

As discussed above, the network computing element(s) 140 may be executable to read out one or more quantum outputs 158 from the quantum computing element(s) 142. For example, the network computing element(s) 140 may be executable to read out the values of $\theta_{j,k}$ from the fourth quantum register. The network computing element(s) 140 is then able to calculate new values in EMML based on the quantum outputs. In some embodiments, the quantum EMML algorithm is an iterative algorithm. In such embodiments, the network computing element(s) 140 are configured to repeat the quantum EMML algorithm discussed above, but with the new values in EMML replacing the template array. That is, the new values in EMML are imported into the first set of qubits instead of the template array. This cycle can be repeated up to a desired number of iterations. Alternatively or in addition, the network computing element(s) 140 may use the new values in EMML to calculate the values for a less noisy data set. For example, where the microscope system 102 generates multiple images of sample 106 (i.e., the data array includes image data for one of the images), the network computing element(s) 140 may then use the new values in EMML to calculate pixel values for a less noisy image of the sample 106.

As shown in FIG. 1, the network computing element(s) 140 may be further executable to generate and transmit a result 160 to the local computing element(s) 132. In some embodiments, the result 160 may be the new dataset values, for example the new pixel values, determined using the quantum computing element(s) 142, the values for a less noisy data set determined using the quantum computing element(s) 142, and/or a construction generated using such determined values. For example, the network computing element(s) 140 may determine a pattern between the first data and the second data using the cross correlation values, which it may then transmit to the local computing element(s) 132. Alternatively, where the request 154 included a first array of image data that comprises pixel values of an image obtained via examination of sample 106 over a first period of time and a second array of image data that comprises pixel values of an image obtained via examination of sample 106 over a second period of time, the network computing element(s) 140 may utilize the first image data, the second image data, and the cross correlation values to generate and transmit a high resolution image to the local computing element(s) 132.

While, FIG. 1 shows example quantum computing environment(s) 100 as optionally including computing elements 132 and/or 140, those skilled in the art will appreciate that the computing elements 132 and 140 depicted and described in association with in FIG. 1 are merely illustrative and are not intended to limit the scope of the present disclosure. The computing system and devices may include any combination of hardware or software that can perform the indicated functions, including computers, network devices, internet appliances, PDAs, wireless phones, controllers, oscilloscopes, amplifiers, etc. The computing elements 132 and 140 may also be connected to other devices that are not illustrated, or instead may operate as a stand-alone system. In addition, the functionality provided by the illustrated components may in some implementations be combined in fewer components or distributed in additional components. Similarly, in some implementations, the functionality of some of the illustrated components may not be provided and/or other additional functionality may be available. The computing elements 132 and 140 may receive user selections via a keyboard, mouse, touchpad, touchscreen, etc.

Figure 2:
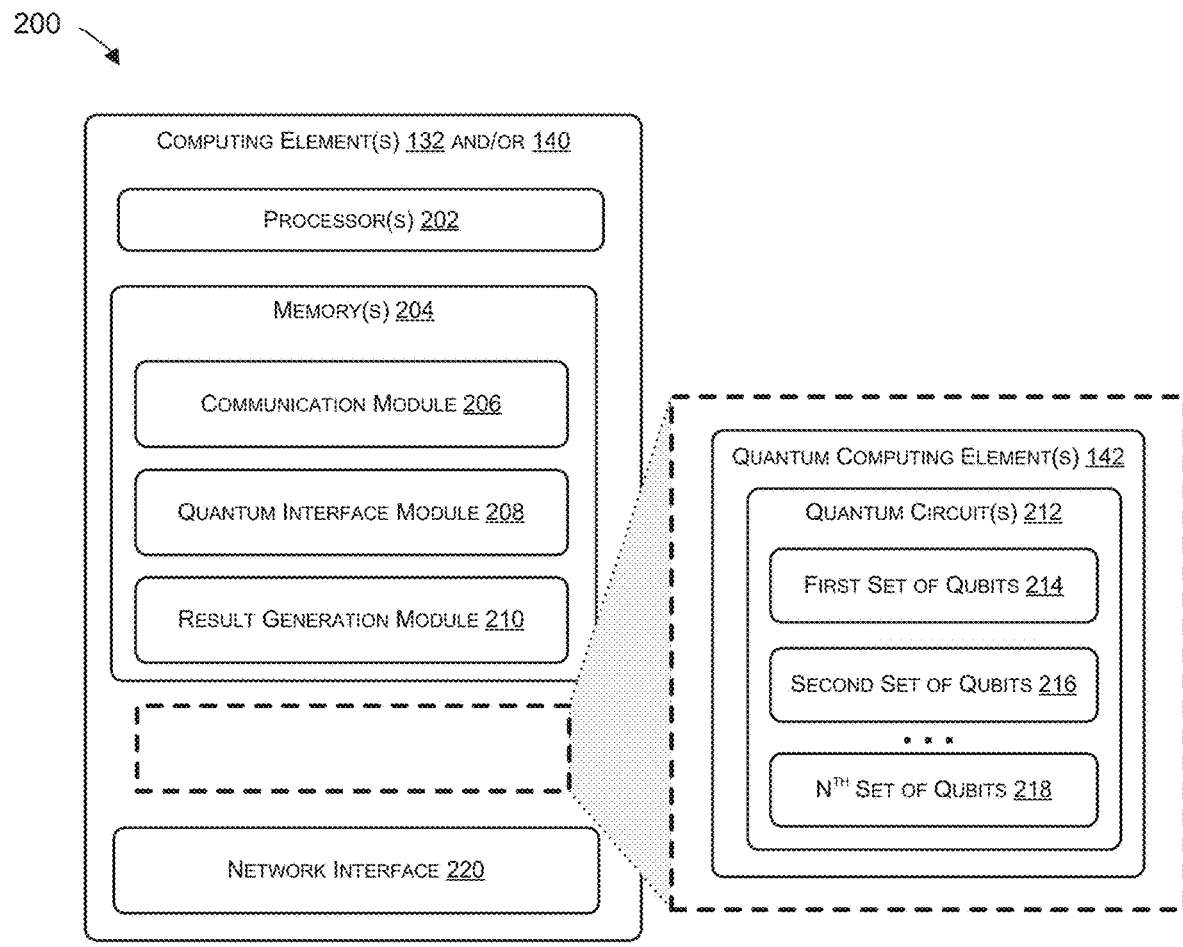
FIG. 2 is a schematic illustration of a quantum computing system for quantum computing based sample analysis.

FIG. 2 depicts a schematic diagram illustrating computing architecture 200 of example computing element(s) 132 and/or 140 executable to perform quantum computing based sample analysis. FIG. 2 illustrates additional details of hardware and software components that can be used to implement the techniques described in the present disclosure. For example, the computing architecture 200 may be used within environment 100, and/or to execute one or more processes 300 and 500, and/or include one or more of quantum computing circuits 400 and 600, or in other environments and computing devices. In the example computing architecture 200, the example computing element(s) 132 and/or 140 includes one or more processors 202 and memory 204 communicatively coupled to the one or more processors 202.

The example computing architecture 200 can include a communication module 206, a quantum interface module 208, and a result generation module 210 stored in the memory 204. As used herein, the term "module" is intended to represent example divisions of executable instructions for purposes of discussion and is not intended to represent any type of requirement or required method, manner or organization. Accordingly, while various "modules" are described, their functionality and/or similar functionality could be arranged differently (e.g., combined into a fewer number of modules, broken into a larger number of modules, etc.). Further, while certain functions and modules are described herein as being implemented by software and/or firmware executable on a processor, in other instances, any or all of modules can be implemented in whole or in part by hardware (e.g., a specialized processing unit, etc.) to execute the described functions. In various implementations, the modules described herein in association with the example computing architecture 200 can be executed across multiple devices.

The communication module 206 can be executable by the processors 302 to transmit data between the example computing architecture 200, the microscope system 102, and/or other computing elements in the environment 100 via a network interface 220. For example, the communication module 206 may be executable to receive requests from one or more of a microscope system 102, a local computing element 132, or another computing element. Such requests may include input data (e.g., sensor data generated by one or more sensors associated with the microscope system 102), and one or more functions or procedures that trigger the computing architecture 200 to facilitate quantum processing of the input data via the quantum computing element(s) 142 to process the input data, and/or generate a requested result based on the outputs of the quantum computing element(s). For example, the communication module 206 may receive a request that includes input data that corresponds to pixel values for two images, and a request to generate a modified image using cross correlation values computed at least in part via the quantum computing element(s) 142. The communication module 206 is further executable to transmit a result to the microscope system 102, the local computing element 132, or other computing element that includes the requested result.

The quantum interface module 208 can be executable by the processors 302 to facilitate the quantum processing of the input data via the quantum computing element(s) 142. For example, the quantum interface module 208 may be configured to prepare the input data, input the prepared input data to the quantum computing element(s) 142, and extract quantum outputs from the quantum computing element(s) 142. Preparing the input data includes processing the input data so that it is in a form that can be received and/or processed by the quantum element(s) 142. For example, according to the present disclosure the data may be normalized so that each individual element $(x_j)$ of the data is real, positive number.

In some embodiments, where a request includes a data array, a template array, and a request to generate a less noisy data array, the quantum interface module 208 may prepare the data array and the template array to be input into one or more quantum registers (i.e., sets of qubits) within a quantum circuit of the quantum computing element(s) 142 that is configured to perform a quantum EMML algorithm. Alternatively, where the request includes multiple data arrays and a request to generate a less noisy data array, then preparing the input data may also include generating a template array from the multiple data arrays.

The quantum interface module 208 is also executable to read out one or more quantum outputs from the quantum computing element(s) 142. For example, where the request required the computation of cross correlation, the quantum interface module 208 may be executable to read out the values of $\theta_j$ from a quantum register of a quantum circuit 212 within the quantum computing element(s) 142. Alternatively, where the request required the application of a quantum EMML algorithm, the quantum interface module 208 may be executable to read out the values of $\theta_{j,k}$ from a quantum register of a quantum circuit 212 within the quantum computing element(s) 142.

The result generation module 210 can be executable by the processors 302 to automatically generate the requested result based on the quantum output from the quantum computing elements 142. For example, where the request required the computation of cross correlation, the result generation module 210 may be executable to utilize the values of $\theta_j$ to calculate the cross correlation values associated with the input data provided in the request. In some embodiments, the result generation module 210 may be further executable to generate a new data structure (e.g., an image or another type of data structure in which the cross correlation values and/or other values calculated therefrom are stored/used) and/or new data array based on the calculated cross correlation values. For example, where the input data included the pixel values of a first and second image of a sample, the result generation module 210 may generate a combined image based on the pixel values of the first image, the pixel values of the second image, and the calculated cross correlation values.

In another example, where the request required application of the quantum EMML algorithm, the result generation module 210 may be executable to utilize the values of $\theta_{j,k}$ to generate new values in EMML for the input data in the request. In some embodiments, this may further involve generating a new data array that is less noisy than the input data in the request. As discussed above, such generated results may be transmitted to the microscope system 102, the local computing element 132, or other computing element by the communications module 206.

FIG. 2 further illustrates the computing architecture 200 as optionally including quantum computing element(s) 142. Alternatively, the quantum computing elements(s) 142 may be part of a separate computing architecture that is in wired or wireless communication with the computing architecture 200. The quantum computing element(s) 142 include one or more quantum gate processors, which may include one or more quantum circuits 212 (i.e., models for quantum computation in which a computation is performed using a sequence of quantum logic gates) operating on a number of qubits (i.e., quantum bits) within the quantum element(s). As shown in FIG. 2, the quantum element(s) 142 may include one or more quantum circuit(s) 212 that comprises a plurality of quantum registers, where each quantum register comprises multiple qubits (i.e., the first set of qubits 214, the second set of qubits 216, the $n^{th}$ set of qubits 218, etc.) that can store data in quantum superposition.

FIG. 2 further shows the computing architecture 200 as including a network interface 220 for communicating with one or more other computing elements. The network interface 220 may be a wired interface, a wireless interface, or both.

Those skilled in the art will appreciate that the computing architecture 200 is merely illustrative and is not intended to limit the scope of the present disclosure. In particular, the computing system and devices may include any combination of hardware or software that can perform the indicated functions, including computers, network devices, internet appliances, PDAs, wireless phones, controllers, oscilloscopes, amplifiers, etc. The computing architecture 200 may also be connected to other devices that are not illustrated, or instead may operate as a stand-alone system. In addition, the functionality provided by the illustrated components may in some implementations be combined in fewer components or distributed in additional components. Similarly, in some implementations, the functionality of some of the illustrated components may not be provided and/or other additional functionality may be available.

The one or more processors 202 may be configured to execute instructions, applications, or programs stored in the memories 204. In some examples, the one or more processors 202 may include hardware processors that include, without limitation, a hardware central processing unit (CPU), a graphics processing unit (GPU), and so on. While in many instances the techniques are described herein as being performed by the one or more processors 202, in some instances the techniques may be implemented by one or more hardware logic components, such as a field programmable gate array (FPGA), a complex programmable logic device (CPLD), an application specific integrated circuit (ASIC), a system-on-chip (SoC), or a combination thereof.

The memories 204 are examples of computer-readable media. Computer-readable media may include two types of computer-readable media, namely computer storage media and communication media. Computer storage media may include volatile and non-volatile, removable, and non-removable media implemented in any method or technology for storage of information, such as computer readable instructions, data structures, program modules, or other data. Computer storage media includes, but is not limited to, random access memory (RAM), read-only memory (ROM), erasable programmable read only memory (EEPROM), flash memory or other memory technology, compact disc read-only memory (CD-ROM), digital versatile disk (DVD), or other optical storage, magnetic cassettes, magnetic tape, magnetic disk storage or other magnetic storage devices, or any other non-transmission medium that may be used to store the desired information and which may be accessed by a computing device. In general, computer storage media may include computer executable instructions that, when executed by one or more processing units, cause various functions and/or operations described herein to be performed. In contrast, communication media embodies computer-readable instructions, data structures, program modules, or other data in a modulated data signal, such as a carrier wave, or other transmission mechanism. As defined herein, computer storage media does not include communication media.

Those skilled in the art will also appreciate that, while various items are illustrated as being stored in memory or storage while being used, these items or portions of them may be transferred between memory and other storage devices for purposes of memory management and data integrity. Alternatively, in other implementations, some or all of the software components may execute in memory on another device and communicate with the illustrated computing architecture 200. Some or all of the system components or data structures may also be stored (e.g., as instructions or structured data) on a non-transitory, computer accessible medium or a portable article to be read by an appropriate drive, various examples of which are described above. In some implementations, instructions stored on a computer-accessible medium separate from the computing architecture 200 may be transmitted to the computing architecture 200 via transmission media or signals such as electrical, electromagnetic, or digital signals, conveyed via a communication medium such as a wireless link. Various implementations may further include receiving, sending or storing instructions and/or data implemented in accordance with the foregoing description upon a computer-accessible medium.

The architectures, systems, and individual elements described herein may include many other logical, programmed, and physical components, of which those shown in the accompanying figures are merely examples that are related to the discussion herein.

Figure 3:
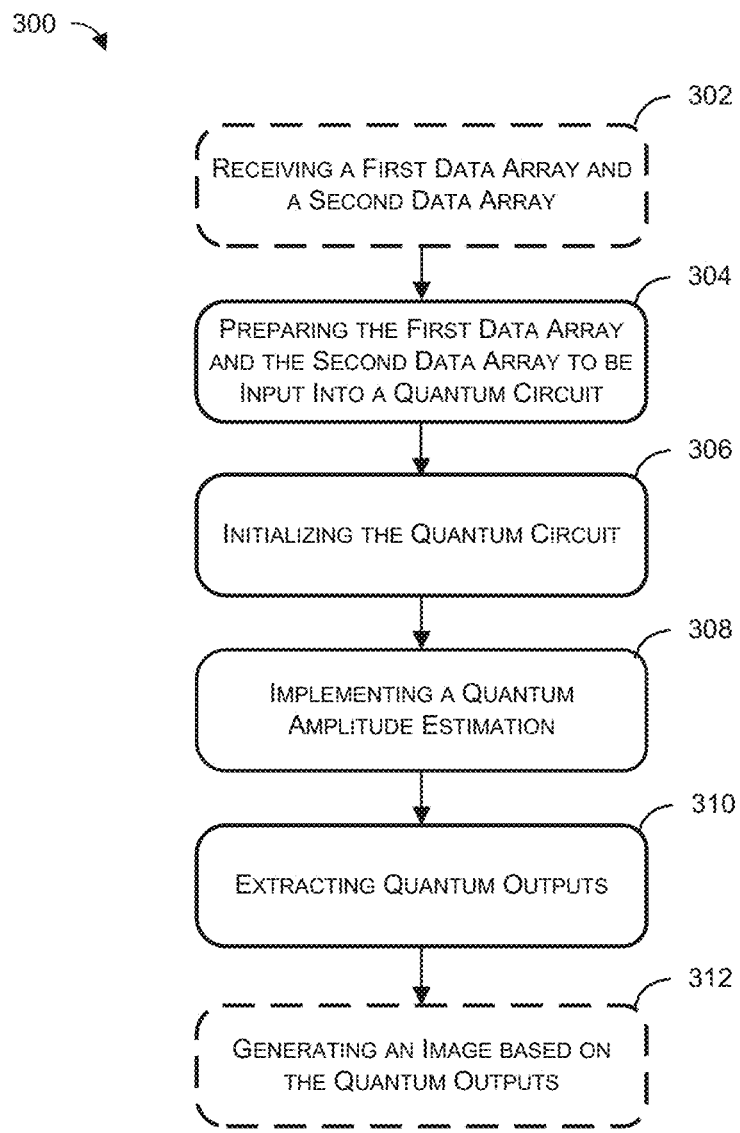
FIG. 3 depicts a sample process for leveraging cross correlation techniques in combination with quantum computing capabilities to drastically reduce the time required to process multiple sets of data.
Figure 5:
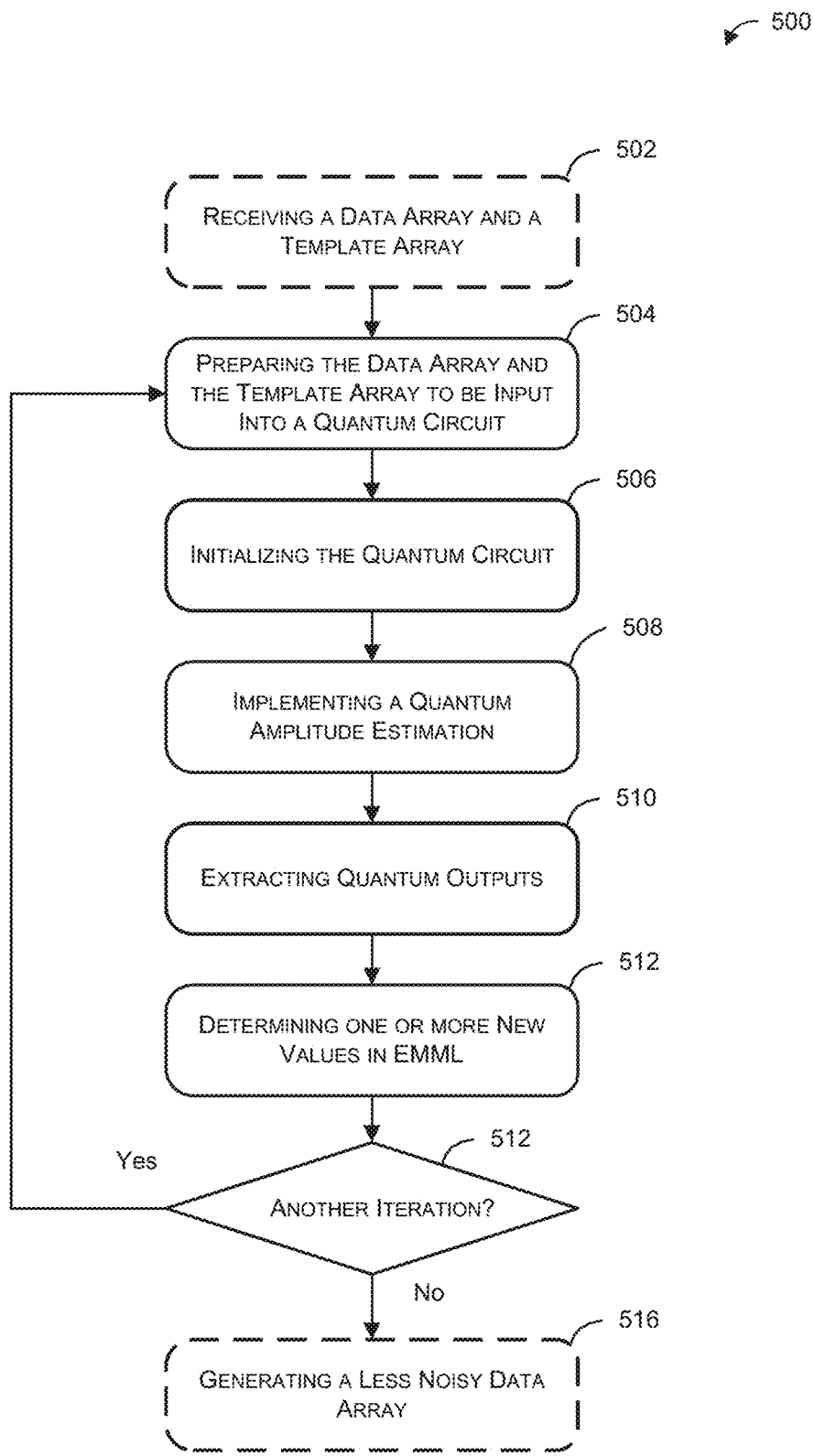
FIG. 5 depicts a sample process for generating less noisy data sets by applying a quantum expectation maximization maximum likelihood (EMML) algorithm to two or more data sets.

FIGS. 3 and 5 are a flow diagram of illustrative processes illustrated as a collection of blocks in a logical flow graph, which represent a sequence of operations that can be implemented in hardware, software, or a combination thereof. In the context of software, the blocks represent computer-executable instructions stored on one or more computer-readable storage media that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described blocks can be combined in any order and/or in parallel to implement the processes.

FIG. 3 is a flow diagram of an illustrative process 300 for leveraging cross correlation techniques in combination with quantum computing capabilities to drastically reduce the computation complexity to process multiple sets of data. By reducing the complexity of the computations of cross correlation techniques in this way, the time required for processing large quantities of data (e.g., processing data from optical/charged particle microscopes to generate specimen images) can be greatly reduced. The process 300 may be implemented in environment 100 and/or by the computing architecture 200 described above, and/or the quantum computing circuit 400, and/or in other environments and computing devices.

At 302, a first data array and a second data array are optionally received by the computing device. A data array comprises a set of data values. An example of a data array is a set of pixel values for an image. In some embodiments, receiving a first data array and a second data array may include receiving a first data array that corresponds to first image data, and the second data array corresponds to second image data. For example, the first image data may include pixel values for an image of a sample that is captured using an ion beam/electron microscope, and the second image data may include pixel values for an additional image of the sample that is captured using an ion beam/electron microscope. In some embodiments, receiving the first data array and the second data array may include generating the first data array and the second data array. For example, the computing device may receive raw data from another source (e.g., sensor data from one or more sensors of a microscope system), and then generate a first data array (e.g., pixel values for a first image of a sample) and a second data array (e.g., pixel values for a second image of the sample) from the raw data.

In some embodiments, the first data array and the second data array may be received by the computing device and from a different computing device associated with the ion beam/electron microscope over a network connection. For example, the first data array and the second data array may be received via a request from the different computing device. The request may include the first data array, the second data array, one or more identifiers (e.g., a security key, a password, a user ID, a device ID, an encryption key, or other data constructs configured to identify and/or validate the different computing device), and/or one or more functions or procedures that trigger the computing device to perform a requested set of actions. Such a request may be transmitted via an application programming interface API that enables communication between the computing device and the different computing device.

At 304, the first data array and the second data array are prepared to be input into a quantum circuit. Preparing the first data array and the second data array includes processing each of the data arrays so that they are in a form that can be received and/or processed by a quantum circuit. Preparing the first data array and the second data array also includes normalizing and/or converting the first data array and the second data array to positive values prior to importing them into the quantum computer.

At 306, the quantum circuit is initialized. Initializing the quantum circuit includes using one or more quantum encoding operators to import the first data array into a first set of qubits of the quantum circuit, and importing the second data array into a second set of qubits of the quantum circuit. Importing data into a set of qubits corresponds to storing individual data values of the array as a probability of the corresponding position state. Specifically, importing such data generates a superposition of quantum states inside the corresponding set of qubits of the quantum circuit such that the amplitude of each state is put equal to the square root of one of the experimental values.

For example, the quantum encoding operator may correspond to $A_A(A_B)$. In some embodiments, the first data array is imported into the first set of qubits as:

$$\Sigma_{j=0}^{N-1} \sqrt{x_j^A} |j\rangle, \tag{1}$$

and the second data array is imported into the second set of qubits as:

$$\sum_{j'=0}^{N-1} \sqrt{x_{j'}^B} \left| j' \right\rangle. \quad (2)$$

Initializing the quantum circuit further includes initializing a third set of qubits in the quantum circuit so that it can be used for the superposition of all the values of a function variable during the calculation of cross correlations of the first data array and the second data array. According to the present invention, the third set of qubits comprises applying a $H^{\otimes \log N}$ gate to the third set of qubits, where H is a Hadamard operator, and N is the number of qubits in the third set of qubits. After the $H^{\otimes \log N}$ gate is applied to the third set of qubits, the state of the third set of qubits is:

$$\frac{1}{\sqrt{N}} \sum_{J=0}^{N-1} \left| J \right\rangle_{var}. \quad (3)$$

Additionally, the state of the quantum circuit after each of the first, second, and third set of qubits are initialized is:

$$\frac{1}{\sqrt{N}} \sum_{J=0}^{N-1} \left| J \right\rangle_{var} \sum_{j,j'=0}^{N-1} \sqrt{x_j^A x_{j'}^B} \left| j, j' \right\rangle \left| 0 \right\rangle^{\otimes \log M}. \quad (4)$$

At 308, a quantum amplitude estimation is implemented over the quantum circuit. The QAE comprises applying a quantum Fourier transform (QFT) over the fourth set of qubits, wherein after the QFT is applied the state of the fourth set of qubits is in the form:

$$\Sigma_{m=0}^{M-1} \left| m \right\rangle. \quad (5)$$

Implementing the QAE further comprises applying a controlled $Q^M \Lambda_M(Q)$ to the first set of qubits, the second set of qubits, the third set of qubits, and the fourth set of qubits, where the quantum operator $\Lambda_M(Q)$ is defined as:

$$\Lambda_M(Q) \left| y \right\rangle_{var\ AB} \left| m \right\rangle_{cor} = Q^m \left| y \right\rangle_{var\ AB} \left| m \right\rangle_{cor}, \quad (6)$$

and Q is a Grover quantum operator that is equal to $AS_0 A^{-1} S_{J_A \ominus J_B' = \tau_{var}}$. After the controlled $Q^M \Lambda_m(Q)$ is applied, the state of the first set of qubits, the second set of qubits, and the third set of qubits, as a function of the eigenvectors of Q, $\left| j \right\rangle \left| \psi_+^\tau \right\rangle$, and $\left| j \right\rangle \left| \psi_-^\tau \right\rangle$, corresponds to:

$$-\frac{i}{\sqrt{2N}} \sum_{J=0}^{N-1} \left| J \right\rangle_{var} \left( e^{i\theta J} \left| \psi_+^J \right\rangle_{AB} - e^{-i\theta J} \left| \psi_-^J \right\rangle_{AB} \right). \quad (7)$$

According to the present disclosure, implementing the quantum amplitude estimation further includes performing an inverse QFT over the fourth set of qubits to get:

$$-\frac{i}{\sqrt{2N}} \sum_{J}^{N-1} \left| J \right\rangle_{var} \left( e^{i\theta J} \left| \psi_+^J \right\rangle_{AB} \left| M \left( \frac{\theta_J}{\pi} \right) \right\rangle_{cor} - e^{-i\theta J} \left| \psi_-^J \right\rangle_{AB} \left| M \left( 1 - \frac{\theta_J}{\pi} \right) \right\rangle_{cor} \right). \quad (8)$$

Because $$\langle C_J \rangle = \frac{1}{N},$$

it is reasonable to conclude that $\theta_j$ is a value of the order of $$\frac{1}{\sqrt{N}}.$$

Therefore, $M = \alpha \sqrt{N}$, where $\alpha << N$ can be chosen in a second moment. Thus, the complexity of the QAE is upper bounded by $O(\sqrt{N})$.

At 310, quantum outputs are extracted from the quantum computer. Specifically, the computing device determines value(s) of $\theta_j$ in the fourth set of qubits. Then at 314, an image is optionally generated based on the cross correlation values. For example, where the first data array is pixel values of a first image of a sample and the second data array is pixel values of a second image of the sample, the cross correlation values may correspond to a shift between the two images. The computing device may be configured to utilize the use such a shift to combine the first data array and the second data array to generate a new image of the sample. Alternatively, or in addition, the system may use the quantum outputs from the quantum computer to determine a shift vector (e.g., a position where the cross-correlation value is maximal), a limited number of shift vectors, or an optimal and/or average value for the first data array and the second data array.

Figure 4:
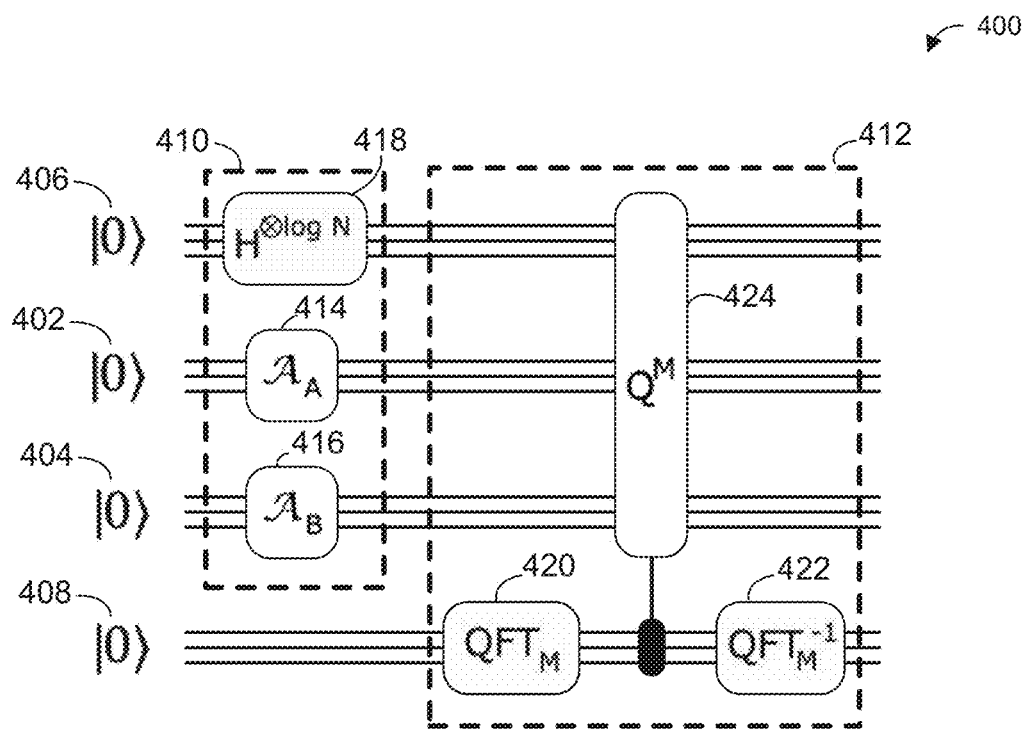
FIG. 4 is a diagram that illustrates a quantum circuit for computing and storing cross correlations according to the present disclosure.
Figure 6:
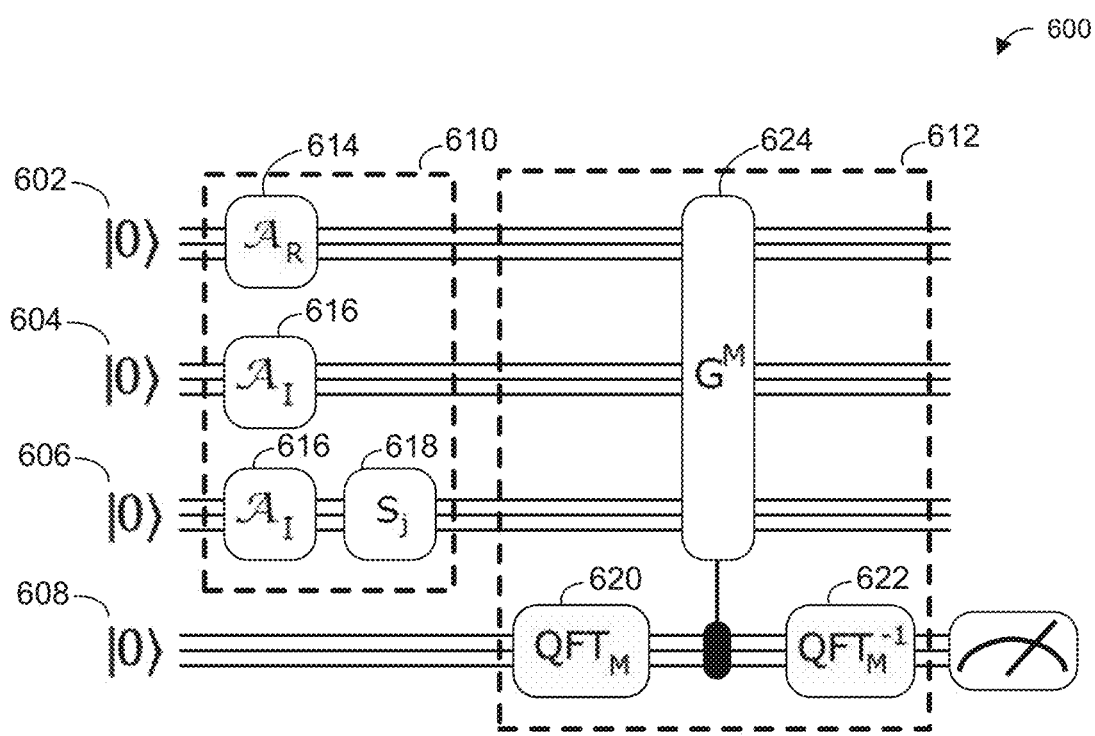
FIG. 6 is a diagram that illustrates a quantum circuit for applying a quantum EMML algorithm to two data sets.

FIGS. 4 and 6 are illustrations of example quantum circuits according to the present disclosure. Specifically, FIG. 4 shows an example quantum circuit 400 for performing cross correlation according to the present disclosure. The quantum circuit 400 may be implemented to perform the process 300, and/or in environment 100 and/or by the computing architecture 200 described above, or in other environments and computing devices.

FIG. 4 shows quantum circuit 400 as including a first set of qubits 402, a second set of qubits 404, a third set of qubits 406, and a fourth set of qubits 408. Each of the first set of qubits 402, the second set of qubits 404, and the third set of qubits 406 are of a dimension log N, where N corresponds to the number of elements in each of the first and second data array. The fourth set of qubits 408 is of the dimension log M, where log M is equal to the number of digits of precision that the amplitude of the cross correlations function is calculated with.

FIG. 4 further illustrates the initialization 410 and the QAE 412 of the quantum circuit 400. During the initialization 410, the first data array 414 and the second data array 416 are imported into the first set of qubits 402 and the second set of qubits 406, respectively, using one or more quantum encoding operators. FIG. 4 also shows the initialization 410 as including a $H^{\otimes \log N}$ 418 gate being applied to the third set of qubits 406.

In FIG. 4 the QAE 412 is shown as including the application of a QFT 420 and an inverse QFT 422 being applied to the fourth set of qubits 408. The QAE 412 is further shown as including a controlled $Q^M \Lambda_M(Q)$ gate 424 being applied to the first set of qubits 402, the second set of qubits 404, the third set of qubits 406, and the fourth set of qubits 408. The controlled $Q^M \Lambda_m(Q)$ gate 424 is shown as being applied between the application of the QFT 420 and an inverse QFT 422.

FIG. 5 is a flow diagram of an illustrative process 500 for generating less noisy data sets by applying a quantum expectation maximization maximum likelihood (EMML) algorithm to two or more data sets. The process 500 may be implemented in environment 100 and/or by the computing architecture 200 described above, and/or the quantum computing circuit 600, and/or in other environments and computing devices.

At 502, a data array and a template array are optionally received by the computing device. A data array comprises a set of data values. An example of a data array is a set of pixel values for an image. A template array corresponds to a set of values that are given by an average of the data of the set of data arrays. For example, where a set of data arrays corresponds to a set of images with individual data arrays comprising the pixel values for a corresponding image, data for one of the images, then the template array corresponds to a data array of the average pixel values across the multiple images of the set of images.

In some embodiments, receiving the data array and the template array may include generating the data array and/or the template array. For example, the computing device may receive raw data from another source (e.g., sensor data from one or more sensors of a microscope system), and then generate the data array (e.g., pixel values for an image of a sample) and/or a template array (e.g., an average pixel value across a set of images of the sample) from the raw data. In another example, the computing device may receive a set of data arrays and generate the template array for the set of data arrays. For example, the computing device may generate a template array whose set of values $\{X_{j,k}^n\}$ are given by the average of the data of the set of data arrays, where j and k are pixel coordinates, and n identifies the number of iteration.

In some embodiments, the data array and the template array may be received by the computing device from a different computing device, such as a computing device associated with the ion beam/electron microscope over a network connection. For example, the data array and the template array may be received via a request from the different computing device. The request may include the data array, the template array, one or more identifiers, and/or one or more functions or procedures that trigger the computing device to perform a requested set of actions. Such a request may be transmitted via an application programming interface API that enables communication between the computing device and the different computing device.

At 504, the data array and the template array are prepared to be input into a quantum circuit. Preparing the data array and the template array includes processing each of the arrays so that they are in a form that can be received and/or processed by a quantum circuit.

At 506, the quantum circuit is initialized. Initializing the quantum circuit includes using one or more quantum encoding operators to import the template array into a first set of qubits of the quantum circuit, and importing the data array into a second set of qubits of the quantum circuit and a third set of qubits of the quantum circuit. Importing data into a set of qubits corresponds to storing individual data values of the array as a probability of the corresponding position state.

Specifically, importing such data generates a superposition of quantum states inside the corresponding set of qubits of the quantum circuit such that the amplitude of each state is put equal to the square root of one of the experimental values.

For example, the quantum encoding operator for importing the data array may correspond to $A_I$. In some embodiments, the data array is imported into the second and third sets of qubits as:

$$A_I|0\rangle^{\otimes 2 \log N} = \Sigma_{j,k=0}^{N-1} \sqrt{x_{j,k}^n}|j,k\rangle. \qquad (9)$$

Additionally, the quantum encoding operator for importing the template array may correspond to $A_T$, which may encode the template array in the first set of qubits as:

$$A_T|0\rangle^{\otimes 2 \log N} = \Sigma_{j,k=0}^{N-1} \sqrt{X_{j,k}^n}|j,k\rangle. \qquad (10)$$

where wherein $A = A_T \otimes A_I \otimes (S_{j,k}A_I)$. Once the $A_I$ and the $A_T$ gates are applied to the quantum circuit, the total state of the first, second, and third sets of qubits in the quantum computer corresponds to:

$$\Sigma_{j'',k''=0}^{N-1} \sqrt{X_{j'',k''}^n}|j'',k''\rangle_{templ} \otimes \Sigma_{j',k'=0}^{N-1} \sqrt{x_{j',k'}^n}|j',$$
$$k'\rangle_{C1} \otimes \Sigma_{\tilde{j},\tilde{k}=0}^{N-1} \sqrt{x_{\tilde{j},\tilde{k}}^n}|\tilde{j},\tilde{k}\rangle \otimes |0\rangle_{new}^{\otimes \log M}. \qquad (11)$$

Initializing the quantum circuit further includes implementing a difference operation on the third set of qubits. For example, the quantum operator may be a $S_{j,k}$ gate that is applied to the third set of qubits to implement the difference operation of:

$$\sum_{\tilde{J},\tilde{k}=0}^{N-1} \sqrt{x_{\tilde{J},\tilde{k}}^n}|\tilde{J},\tilde{k}\rangle \xrightarrow{yields} \sum_{\tilde{J},\tilde{k}=0}^{N-1} \sqrt{x_{\tilde{J},\tilde{k}}^n}|\tilde{J} \ominus j, \tilde{k} \ominus k\rangle, \qquad (12)$$

Where $\ominus$ is the difference in base N. After the $S_{j,k}$ gate is applied, the initial state of the first, second, and third sets of qubits in the quantum computer corresponds to:

$$\sum_{j'',k''=0}^{N-1} \sqrt{X_{j'',k''}^n} |j'',k''\rangle_{templ} \otimes \sum_{j',k'=0}^{N-1} \sqrt{x_{j',k'}^n} |j',k'\rangle_{C1} \otimes \sum_{\tilde{J},\tilde{k}=0}^{N-1} \sqrt{x_{j \oplus \tilde{J}, k \oplus \tilde{k}}^n} |\tilde{J},\tilde{k}\rangle_{C2} \otimes |0\rangle_{new}^{\otimes \log M}. \qquad (13)$$

According to the present disclosure, initializing the quantum circuit may further include initializing a fourth set of qubits in the quantum computer by applying a $H^{\otimes \log M}$ gate to the fourth set of qubits.

At 508, a QAE is implemented over the quantum circuit. The QAE comprises applying a quantum Fourier transform (QFT) over the fourth set of qubits, and then applying a controlled $G^M \Gamma_M(G)$ gate to the first set of qubits, the second set of qubits, the third set of qubits, and the fourth set of qubits, where the quantum operator $\Gamma_M(G)$ is defined as:

$$\Gamma_M(G)|y\rangle_{templ,C1,C2}|m\rangle_{new} = G^M|y\rangle_{temple,C1,C2}|m\rangle_{new} \qquad (14)$$

and G is a Grover quantum operator that is equal to $AS_0 A^{-1} S_{j_{C1B}"\ominus j_{templ}=j_{c2}}$. After the controlled $G^M \Gamma_m(G)$ gate is applied, the state of the first set of qubits, the second set of qubits, and the third set of qubits, when written in terms of the eigenstates $|\psi_\pm\rangle_{templ,C1,C2}$ of the Grover operator G is:

$$-\frac{i}{\sqrt{2}} \left( e^{i\theta_{j,k}} |\psi_+\rangle_{templ,C1,C2} \left| S_M\left(\frac{\theta_{j,k}}{\pi}\right) \right\rangle_{new} - \qquad (15)$$

-continued $$e^{-i\theta_{j,k}}|\psi_-\rangle_{templ,C1,C2}\left|S_M\left(1-\frac{\theta_{j,k}}{\pi}\right)\right\rangle_{new}),$$

wherein:

$$\left|S_M\left(1-\frac{\theta_{j,k}}{\pi}\right)\right\rangle_{new} = \sum_{m=0}^{M-1} e^{2im\theta_{j,k}}|m\rangle_{new}. \tag{16}$$

According to the present disclosure, implementing the QAE further includes performing an inverse QFT over the fourth set of qubits to get the state:

$$-\frac{i}{\sqrt{2}}\left(e^{i\theta_{j,k}}|\psi_+\rangle_{templ,C1,C2}\left|M\left(\frac{\theta_{j,k}}{\pi}\right)\right\rangle_{new} - \right. \tag{17}$$

$$\left. e^{-i\theta_{j,k}}|\psi_-\rangle_{templ,C1,C2}\left|M\left(1-\frac{\theta_{j,k}}{\pi}\right)\right\rangle_{new}\right).$$

At 510, quantum outputs are extracted from the quantum circuit. Specifically, the computing device determines value(s) $\Theta_{j,k}$ in the fourth set of qubits. Then, at 512, one or more new values in EMML are determined based on the value(s) of $\Theta_{j,k}$. Specifically, the new values in EMML are determined by the computing device calculating $$\sin^2\frac{\pi}{M}\Theta_{j,k}.$$

At 512, it is determined whether another iteration of the quantum EMML algorithm is desired. If the answer at 510 is yes, the process continues to step 504, and the quantum EMML algorithm is repeated, but with the new values in EMML replacing the template array. That is, the new values in EMML are prepared to be imported into the first set of qubits instead of the template array.

If the answer at 512 is no, the process continues to step 514, and a less noisy data set is optionally generated based on the new values in EMML. For example, where the data array is pixel values of an image of a sample, the computing device may use the data array, data arrays from other images of the sample, and the new values in EMML to generate a new image of the sample that is less noisy than the previous images. Less noisy may correspond to a more detailed, higher resolution, more reliable, more refined, and/or smoothened data set.

FIG. 6 shows an example quantum circuit 600 for applying a quantum EMML algorithm to two or more data sets. The quantum circuit 600 may be implemented to perform the process 500, and/or in environment 100 and/or by the computing architecture 200 described above, or in other environments and computing devices.

FIG. 6 shows quantum circuit 600 as including a first set of qubits 602, a second set of qubits 604, a third set of qubits 606, and a fourth set of qubits 608. Each of the first set of qubits 602, the second set of qubits 604, and the third set of qubits 606 are of a dimension 2 log N, where N corresponds to the number of elements in each of the data array and the template array. The fourth set of qubits 608 is of the dimension log M, where log M is equal to the number of digits of precision that the new data values in EMML are to be calculated with.

FIG. 6 further illustrates the initialization 610 and the quantum amplitude estimation 612 of the quantum circuit 600. During the initialization 610, the data template 614 is imported in the first set of qubits 602 using a quantum operator. Additionally, initialization 610 is shown as including the data array 616 being imported into the second set of qubits 606 and the third set of qubits 606 using one or more quantum encoding operators. FIG. 4 also shows the initialization 610 as including a difference operation 618 being applied to the third set of qubits 606.

In FIG. 6 the quantum amplitude estimation 612 is shown as including the application of a quantum Fourier transfer 620 and an inverse quantum Fourier transfer 622 being applied to the fourth set of qubits 608. The quantum amplitude estimation 612 is further shown as including a controlled $G^M\Gamma_M(G)$ gate 624 being applied to the first set of qubits 602, the second set of qubits 604, the third set of qubits 606, and the fourth set of qubits 608. The controlled $G^M\Gamma_M(G)$ gate 624 is shown as being applied between the application of the QFT 620 and an inverse QFT 622.

Examples of inventive subject matter according to the present disclosure are described in the following enumerated paragraphs.

A1. A method for computing cross-correlations of two images using a quantum processing system, the method comprising:
  importing first image data and second image data into a quantum circuit, wherein the quantum circuit comprises:
    a first set of qubits configured to receive the first image data;
    a second set of qubits configured to receive the second image data;
    a third set of qubits configured to store shift values; and
    a fourth set of qubits where a cross-correlation function is calculated;
  implementing a quantum amplitude estimation (QAE) between: the first set of qubits, the second set of qubits, and third set of qubits; and the fourth set of qubits; and
  determining, based at least in part on one or more shift values in the third set of qubits, the cross-correlation values for the first image data and the second image data; and
  generating an image based at least in part on the first image data, the second image data, and the cross-correlation values for the first image data and the second image data.

A1.1. The method of paragraph A1, wherein the first image data and the second image data are generated based on sensor data detected by one or more sensors.

A1.2. The method of any of paragraphs A1A-1.1, wherein the first image data and the second image data image data are generated at least in part using an ion beam/electron microscope.

A1.2.1. The method of paragraph A1.2, further comprising receiving the first image data and the second image data image data from a computing device associated with the ion beam/electron microscope over a network connection.

A1.3. The method of any of paragraphs A1.1A1.2.1, wherein the first image data and the second image data are generated in association with a sample.

A1.4. The method of any of paragraphs A1.1A1.3, wherein the first image data is generated at a first time, and the second image data is generated at a second time.

A2. The method of any of paragraphs A1-A1.4, wherein importing the first image data into the quantum circuit comprises storing the individual pixel values of the first image data as a probability of the corresponding position state.

A3. The method of any of paragraphs A1-A2, wherein importing the first image data and the second image data into the quantum circuit comprises normalizing and/or converting the first image data and the second image data to positive values prior to importing them into the quantum computer.

A4. The method of any of paragraphs A1-A3, further comprising generating an image based at least in part on the first image data, the second image data, and the cross-correlation values from the quantum circuit.

A5. The method of any of paragraphs A1-A4, further comprising determining a pattern between the first image data and the second image data based on the cross-correlation values from the quantum circuit.

A5.1. The method of paragraph A5, wherein determining the pattern comprises determining a shift between the first image data and the second image data.

A5.1.1. The method of paragraph A5.1, wherein determining the pattern comprises determining a shift vector for the first data array and the second data array.

A5.1.2. The method of paragraph A5.1, wherein determining the pattern comprises determining a limited number of shift vectors for the first data array and the second data array.

A6. The method of any of paragraphs A1-A5.1, wherein each of the first set of qubits and the second set of qubits are of dimension Log N qubits, where N corresponds to the number of pixels of each image data.

A6.1. The method of paragraph A6, wherein importing the first image data into the quantum circuit comprises storing individual pixel values of the first image data separately in individual qubits of the Log N qubits.

A7. The method of any of paragraphs A1-A6.1, wherein the first set of qubits is initialized to store the first image data and the second set of qubits is initialized to store the second image data.

A8. The method of any of paragraphs A1-A7, wherein the third set of qubits is of dimension Log N qubits.

A9. The method of any of paragraphs A1-A8, wherein the fourth register is of a dimension or qubits that corresponds to the number of digits of precision with which an amplitude of the cross-correlation values are calculated.

A10. The method of any of paragraphs A1-A9, wherein the dimension of the fourth set of qubits is Log M qubits, where M corresponds to number of digits of precision with which an amplitude of the cross-correlation values are calculated.

A11. The method of any of paragraphs A1-A10, wherein importing the first image data into the quantum circuit comprises importing the first image data into the first set of qubits.

A11.1. The method of paragraph A11, wherein importing the first image data into the first set of qubits comprises encoding the first image data inside the quantum computer using a quantum encoding operator.

A11.2. The method of any of paragraphs A11A11.1, wherein the first image data is imported into the first set of qubits as:

$\Sigma_{j=0}^{N-1}\sqrt{x_j^A}|j\rangle$.

A12. The method of any of paragraphs A1-A11.2, wherein importing the second image data into the quantum circuit comprises importing the second image data into the second set of qubits.

A12.1. The method of paragraph A12, wherein importing the second image data into the second set of qubits comprises encoding the second image data inside the quantum computer using a quantum encoding operator.

A12.2. The method of any of paragraphs A12-A12.1, wherein the second image data is imported into the second set of qubits as:

$\Sigma_{j'=0}^{N-1}\sqrt{x_{j'}^B}|j'\rangle$.

A13. The method of any of paragraphs A11.1 and A12.1, wherein the quantum encoding operator corresponds to $A_A(A_B)$.

A13.1. The method of paragraph A13, wherein:

$A_A|0\rangle = \Sigma_{j=0}^{N-1}\sqrt{x_j^A}|j\rangle$.

A13.2. The method of any of paragraphs A13-A13.1, wherein:

$A_B|0\rangle \Sigma_{j'=0}^{N-1}\sqrt{x_{j'}^B}|j'\rangle$.

A13.3. The method of any of paragraphs A13A13.2, wherein:

$A = I_{var} \otimes A_A \otimes A_B$.

A14. The method of any of paragraphs A1-A13.3, further comprising reversing the phase of states that fulfil the condition $j_A \ominus j_B' = \bar{j}_{var}$.

A14.1. The method of paragraph A14, wherein reversing the phase of the states that fulfil the condition $j_A \ominus j_B' = \bar{j}_{var}$ is executed using a first quantum phase operator.

A14.1.1. The method of paragraph A14.1, wherein the first quantum phase operator corresponds to:

$$S_x = I_{varAB} - 2 \sum_{j',\mathcal{J}=0}^{N-1} |\mathcal{J}, j, \mathcal{J} \ominus j\rangle\langle \mathcal{J}, j, \mathcal{J} \ominus j|_{varAB}.$$

A15. The method of any of paragraphs A1-A15.1.1, wherein the method further comprises applying a controlled operator to the quantum circuit.

A15.1. The method of paragraph A16, wherein the controlled operator corresponds to: $Q = AS_0 A^{-1} S_x$.

A15.2. The method of any of paragraphs A15-A15.1, wherein the controlled operator is applied to the quantum circuit after the first quantum phase operator is applied to the quantum circuit.

A16. The method of any of paragraphs A1-A15.2, further comprising reversing a phase of the state $A|0\rangle_{AB}$.

A16.1. The method of paragraph A16, wherein reversing the phase of the state $A|0\rangle_{AB}$ further comprises leaving the other states unchanged.

A16.2. The method of any of paragraphs A16-A16.1, wherein reversing the phase of the state $A|0\rangle_{AB}$ is executed using a second quantum phase operator.

A16.2.1. The method of paragraph A16.2, wherein the second quantum phase operator corresponds to: $S_0 = I_{var} \otimes (I - 2|0\rangle\langle 0|)_{AB}$.

A16.2.2. The method of any of paragraphs A16.2-A16.2.1, wherein the second quantum phase operator is applied to the quantum circuit after the first quantum phase operator is applied to the quantum circuit.

A16.2.3. The method of any of paragraphs A16.2-A16.2.2, wherein the second quantum phase operator is applied to the quantum circuit after the controlled operator is applied to the quantum circuit.

A17. The method of any of paragraphs A1-A16.1, further comprising initializing the third set of qubits.

A17.1. The method of paragraph A17, wherein initializing the third set of qubits comprises applying a $H^{\otimes \log N}$ gate to the third set of qubits.

A17.1.1. The method of paragraph A17.1, wherein the H is a Hadamard operator.

A17.1.2. The method of any of paragraphs A17.1-A17.1.1, wherein the state of the third set of qubits after applying the $H^{\otimes \log N}$ is $$\frac{1}{\sqrt{N}} \sum_{j'=0}^{N-1} |j'\rangle_{var}.$$

A17.1.3. The method of any of paragraphs A17.1-A17.1.2, wherein the total state of the quantum circuit after applying the $H^{\otimes \log N}$ is:

$$\frac{1}{\sqrt{N}} \sum_{J=0}^{N-1} |J\rangle_{var} \sum_{j,j'=0}^{N-1} \sqrt{x_j^A x_{j'}^B} |j, j'\rangle |0\rangle^{\otimes \log M}.$$

A18. The method of any of paragraphs A1-A17.1.3, wherein implementing a quantum amplitude estimation comprises applying a quantum Fourier transform (QFT) over the fourth set of qubits.

A18.1. The method of paragraph A18, wherein after applying the QFT the fourth set of qubits is in the form $\Sigma_{m=0}^{M-1} |m\rangle.$ A18.2. The method of any of paragraphs A18-A18.1, wherein implementing a quantum amplitude estimation further comprises applying a controlled $Q^M \Lambda_M(Q)$ to the first set of qubits, the second set of qubits, the third set of qubits, and the fourth set of qubits.

A18.2.1. The method of paragraph A18.2, wherein the quantum operator $\Lambda_M(Q)$ is defined as:

$\Lambda_M(Q)|y\rangle_{var\,AB} |m\rangle_{cor} = Q^M |y\rangle_{var\,AB} |m\rangle_{cor}.$ A18.2.2. The method of any of paragraphs A18.2-A18.2.1, wherein after the controlled $Q^M \Lambda_m(Q)$ is applied, the state of the first set of qubits, the second set of qubits, and the third set of qubits, as a function of the eigenvalues of Q, $|\bar{j}\rangle |\psi_+^J\rangle$, and $|\bar{j}\rangle |\psi_-^J\rangle$, corresponds to:

$$-\frac{i}{\sqrt{2N}} \sum_{J=0}^{N-1} |J\rangle_{var} \left( e^{i\theta_J} |\psi_+^J\rangle_{AB} - e^{-i\theta_J} |\psi_-^J\rangle_{AB} \right).$$

A18.2.2.1. The method of paragraph A18.2.2, wherein the state of the cross-correlation function in the fourth set of qubits after the controlled $Q^M \Lambda_M(Q)$ is applied is $$\sin^2 \theta_J = \sum_{j=0}^{N-1} x_j^A x_{J-j}^B = C_J.$$

A18.2.2.2. The method of any of paragraphs A18.2.2-A18.2.2.1, wherein $|\psi_\pm^J\rangle_{AB}$ are defined as:

$$|\psi_\pm^J\rangle_{AB} = \frac{1}{\sqrt{2}} \left( \frac{1}{\sqrt{C_J}} \sum_{j=0}^{N-1} \sqrt{x_j^A x_{J-j}^B} |j, J-j\rangle_{AB} + \frac{1}{\sqrt{1-C_J}} \sum_{\substack{j,j'=0 \\ j'+J\ominus j}}^{N-1} \sqrt{x_j^A x_{j'}^B} |j, j'\rangle_{AB} \right).$$

A18.2.3. The method of any of paragraphs A18.2-A18.2.2.2, wherein the state of the quantum circuit after the controlled $Q^M \Lambda_M(Q)$ is applied is:

$$-\frac{1}{\sqrt{2N}} \sum_{J=0}^{N-1} |J\rangle_{var} \left( e^{i\theta_J} |\psi_+^J\rangle_{AB} \left|S_M\left(\frac{\theta_J}{\pi}\right)\right\rangle_{cor} - e^{i\theta_J} |\psi_-^J\rangle_{AB} \left|S_M\left(1-\frac{\theta_J}{\pi}\right)\right\rangle_{cor} \right).$$

A18.2.3.1. The method of paragraph A18.2.3, wherein:

$$\left|S_M\left(\frac{\theta_J}{\pi}\right)\right\rangle = \sum_{m=0}^{M-1} e^{2im\theta_J} |m\rangle.$$

A18.3. The method of any of paragraphs A18-A18.2.3.1, wherein the implementing a quantum amplitude estimation further comprises applying an inverse QFT over the fourth set of qubits.

A18.3.1. The method of paragraph A18.3, wherein the state of the fourth set of qubits after the inverse QFT is applied corresponds to:

$$-\frac{i}{\sqrt{2N}} \sum_{J}^{N-1} |J\rangle \left( e^{i\theta_J} |\psi_+^J\rangle_{AB} \left|M\left(\frac{\theta_J}{\pi}\right)\right\rangle - e^{i\theta_J} |\psi_-^J\rangle_{AB} \left|M\left(1-\frac{\theta_J}{\pi}\right)\right\rangle \right).$$

A18.3.1.1. The method of paragraph A18.3.1, wherein $\theta_j$ oscillates around $$\frac{1}{\sqrt{N}}.$$

A18.3.1.2. The method of any of paragraphs A18.3.1A18.3.1.1, wherein the complexity of the amplitude estimation is upper bounded by $O(\sqrt{N})$.

A19. The method of any of paragraphs A1-A18.3.1.2, wherein exporting the cross-correlation values from the quantum circuit comprises reading out the maximum value ($C_{max}$) of the cross-correlation function and the shift ($j_{max}$).

A19.1. The method of paragraph A19, wherein reading out the $C_{max}$ and the $j_{max}$ comprises:
splitting the range of $$\frac{\theta_J}{\pi}$$

from zero to one into 2 subranges;
calculating the state of the fourth set of qubits after the inverse QFT is applied with $2^{n+1}$ digits, where n is the number of steps already realized; and checking how many $$\frac{\theta_J}{\pi}$$

belong to the upper subrange using quantum amplitude estimation.

B1. A method for determining the cross-correlation of two data arrays using a quantum processing system, the method comprising:
importing a first data array and a second data array into a quantum circuit, wherein the quantum circuit comprises:
  a first set of qubits configured to receive the first data array;
  a second set of qubits configured to receive the second data array;
  a third set of qubits configured to store shift values; and
  a fourth set of qubits where the cross-correlation values for the first data array and the second data array are calculated;
implementing a quantum amplitude estimation between:
  the first set of qubits, the second set of qubits, and third set of qubits; and the fourth set of qubits; and
exporting the cross-correlation values from the quantum circuit.

B2. The method of paragraph B1, wherein each of the first set of qubits and the second set of qubits are of dimension Log N qubits, where N corresponds to the number of elements of each data array.

B3. The method of any of paragraphs B1-B2, wherein the first set of qubits is initialized to store the first data array and the second set of qubits is initialized to store the second data sting.

B4. The method of any of paragraphs B1-B3, wherein the third set of qubits is of dimension Log N qubits.

B5. The method of any of paragraphs B1-B4, wherein the fourth register is of a dimension of qubits that corresponds to the number of digits of precision with which an amplitude of the cross-correlation values are calculated.

B6. The method of any of paragraphs B1-B5, wherein the dimension of the fourth set of qubits is Log M qubits, where M corresponds to the number of digits of precision with which an amplitude of the cross-correlation values are calculated.

B7. The method of any of paragraphs B1-B6, wherein importing the first data array into the quantum circuit comprises importing the data into the first set of qubits.

B7.1. The method of paragraph B7, wherein importing the first data array into the first set of qubits comprises encoding the first data array inside the quantum computer using a quantum encoding operator.

B7.2. The method of any of paragraphs B7-B7.1, wherein the first data array is imported into the first set of qubits as:

$$\Sigma_{j=0}^{N-1}\sqrt{x_j^A}|j\rangle.$$

B8. The method of any of paragraphs B1-B7.2, wherein importing the second data array into the quantum circuit comprises importing the second data array into the second set of qubits.

B8.1. The method of paragraph B8, wherein importing the second data array into the second set of qubits comprises encoding the second data array inside the quantum computer using a quantum encoding operator.

B8.2. The method of any of paragraphs B8-B8.1, wherein the second data array is imported into the second set of qubits as:

$$\Sigma_{j'=0}^{N-1}\sqrt{x_{j'}^B}|j'\rangle.$$

B9. The method of any of paragraphs B7.1 and B8.1, wherein the quantum encoding operator corresponds to $A_A(A_B)$.

B9.1. The method of paragraph B9, wherein $A_A|0\rangle = \Sigma_{j=0}^{N-1}\sqrt{x_j^A}|j\rangle$.

B9.2. The method of any of paragraphs B9-B9.1, wherein:

$$A_B|0\rangle = \Sigma_{j'=0}^{N-1}\sqrt{x_{j'}^B}|j'\rangle.$$

B9.3. The method of any of paragraphs B9-B9.2, wherein:

$$A = I_{var} \otimes A_A \otimes A_B.$$

B10. The method of any of paragraphs B1-B9.3, further comprising reversing the phase of states that fulfil the condition $j_A \ominus j_B' = j_{var}$.

B10.1. The method of paragraph B10, wherein reversing the phase of the states that fulfil the condition $j_A \ominus j_B' = j_{var}$ is executed using a first quantum phase operator.

B101.1. The method of paragraph B10.1, wherein the first quantum phase operator corresponds to:

$$S_x = I_{varAB} - 2\sum_{j',\vec{J}=0}^{N-1} |\vec{J}, j, \vec{J} \ominus j\rangle\langle\vec{J}, j, \vec{J} \ominus j|_{varAB}.$$

B11. The method of any of paragraphs B1-B10.1.1, wherein the method further comprises applying a controlled Grover operator to the quantum circuit.

B11.1. The method of paragraph B11, wherein the Grover operator corresponds to: $Q = AS_0A^{-1}S_x$.

B11.2. The method of any of paragraphs B12-B12.1, wherein the controlled Grover operator is applied to the quantum circuit after the first quantum phase operator is applied to the quantum circuit.

B12. The method of any of paragraphs B1-B11.1, further comprising reversing a phase of the state $A|0\rangle_{AB}$.

B12.1. The method of paragraph B12, wherein reversing the phase of the state $A|0\rangle_{AB}$ further comprises leaving the other states unchanged.

B12.2. The method of any of paragraphs B12-B12.1, wherein reversing the phase of the state $A|0\rangle_{AB}$ is executed using a second quantum phase operator.

B12.2.1. The method of paragraph B12.2, wherein the second quantum phase operator corresponds to: $S_0 = I_{var} \otimes (I-2|0\rangle\langle 0|)_{AB}$.

B12.2.2. The method of any of paragraphs B12.2-B12.2.1, wherein the second quantum phase operator is applied to the quantum circuit after the first quantum phase operator is applied to the quantum circuit.

B12.2.3. The method of any of paragraphs B12.2-B12.2.2, wherein the second quantum phase operator is applied to the quantum circuit after the controlled Grover operator is applied to the quantum circuit.

B13. The method of any of paragraphs B1-B12.1, further comprising initializing the third set of qubits.

B13.1. The method of paragraph B13, wherein initializing the third set of qubits comprises applying a $H^{\otimes \log N}$ gate to the third set of qubits.

B13.1.1. The method of paragraph B13.1, wherein the H is a Hadamard operator.

B13.1.2. The method of any of paragraphs B13.1-B13.1.1, wherein the state of the third set of qubits after applying the $H^{\otimes \log N}$ is:

$$\frac{1}{\sqrt{N}}\sum_{\mathcal{J}=0}^{N-1}|\mathcal{J}\rangle_{var}.$$

B13.1.3. The method of any of paragraphs B13.1-B13.1.2, wherein the total state of the quantum circuit after applying the $H^{\otimes \log N}$ is:

$$\frac{1}{\sqrt{N}}\sum_{\mathcal{J}=0}^{N-1}|\mathcal{J}\rangle_{var}\sum_{j,j'=0}^{N-1}\sqrt{x_j^A x_{j'}^B}|j,j'\rangle|0\rangle^{\otimes \log M}.$$

B14. The method of any of paragraphs B1-B13.1.3, wherein implementing a quantum amplitude estimation comprises applying a quantum Fourier transform (QFT) over the fourth set of qubits.

B14.1. The method of paragraph B14, wherein after applying the QFT the fourth set of qubits is in the form:

$\Sigma_{m=0}^{M-1}|m\rangle.$

B14.2. The method of any of paragraphs B14-B14.1, wherein implementing a quantum amplitude estimation further comprises applying a controlled $Q^M \Lambda_M(Q)$ to the first set of qubits, the second set of qubits, the third set of qubits, and the fourth set of qubits.

B14.2.1. The method of paragraph B14.2, wherein the quantum operator $\Lambda_M$ (Q) is defined as:

$\Lambda_M(Q)|y\rangle_{var\,AB}|m\rangle_{cor}=Q^m|y\rangle_{var\,AB}|m\rangle_{cor}.$ B14.2.2. The method of any of paragraphs B14.2-B14.2.1, wherein after the controlled $Q^M \Lambda_m(Q)$ is applied, the state of the first set of qubits, the second set of qubits, and the third set of qubits, as a function of the eigenvalues of Q, $|\bar{j}\rangle |\psi_+^j\rangle$, and $|\bar{j}\rangle |\psi_-^j\rangle$, corresponds to:

$$-\frac{i}{\sqrt{2N}}\sum_{\mathcal{J}=0}^{N-1}|\mathcal{J}\rangle_{var}\left(e^{i\theta_{\mathcal{J}}}|\psi_+^{\mathcal{J}}\rangle_{AB}-e^{i\theta_{\mathcal{J}}}|\psi_-^{\mathcal{J}}\rangle_{AB}\right).$$

B14.2.2.1. The method of paragraph B14.2.2, wherein the cross-correlation values in the fourth set of qubits after the controlled $Q^M \Lambda_M$ (Q) and an inverse quantum Fourier transform are applied are $\theta_j$.

B14.2.2.2. The method of any of paragraphs B14.2.2-B14.2.2.1, wherein $|\psi_{\mp}^{\mathcal{J}}\rangle_{AB}$ are defined as:

$$|\psi_{\mp}^{\mathcal{J}}\rangle_{AB}=\frac{1}{\sqrt{2}}\left(\frac{1}{\sqrt{C_{\mathcal{J}}}}\sum_{j=0}^{N-1}\sqrt{x_j^A x_{\mathcal{J}\ominus j}^B}|j,\mathcal{J}\ominus j\rangle_{AB}+\right.$$

$$\left.\frac{1}{\sqrt{1-C_{\mathcal{J}}}}\sum_{\substack{j,j'=0\\j'\neq \mathcal{J}\ominus j}}^{N-1}\sqrt{x_j^A x_{j'}^B}|j,j'\rangle_{AB}\right).$$

B14.2.3. The method of any of paragraphs B14.2-B14.2.2.2, wherein the state of the quantum circuit after the controlled $Q^M \Lambda_M(Q)$ is applied is:

$$-\frac{1}{\sqrt{2N}}\sum_{\mathcal{J}=0}^{N-1}|\mathcal{J}\rangle_{var}\left(e^{i\theta_{\mathcal{J}}}|\psi_+^{\mathcal{J}}\rangle_{AB}\left|S_M\left(\frac{\theta_{\mathcal{J}}}{\pi}\right)\right\rangle_{cor}-e^{-i\theta_{\mathcal{J}}}|\psi_-^{\mathcal{J}}\rangle_{AB}\left|S_M\left(1-\frac{\theta_{\mathcal{J}}}{\pi}\right)\right\rangle_{cor}\right).$$

B14.2.3.1. The method of paragraph B14.2.3, wherein:

$$\left|S_M\left(\frac{\theta_{\mathcal{J}}}{\pi}\right)\right\rangle=\sum_{m=0}^{M-1}e^{2im\theta_{\mathcal{J}}}|m\rangle.$$

B14.3. The method of any of paragraphs B14-B14.2.3.1, wherein the implementing a quantum amplitude estimation further comprises applying an inverse QFT over the fourth set of qubits.

B14.3.1. The method of paragraph B14.3, wherein the state of the fourth set of qubits after the inverse QFT is applied corresponds to:

$$-\frac{i}{\sqrt{2N}}\sum_{\mathcal{J}=0}^{N-1}|\mathcal{J}\rangle_{var}\left(e^{i\theta_{\mathcal{J}}}|\psi_+^{\mathcal{J}}\rangle_{AB}\left|M\left(\frac{\theta_{\mathcal{J}}}{\pi}\right)\right\rangle_{cor}-e^{-i\theta_{\mathcal{J}}}|\psi_-^{\mathcal{J}}\rangle_{AB}\left|M\left(1-\frac{\theta_{\mathcal{J}}}{\pi}\right)\right\rangle_{cor}\right).$$

B14.3.1.1. The method of paragraph B14.3.1, wherein $\theta_j$ oscillates around $$\frac{1}{\sqrt{N}}.$$

B14.3.1.2. The method of any of paragraphs B14.3.1-B14.3.1.1, wherein the complexity of the amplitude estimation is upper bounded by $O(\sqrt{N})$.

B16. The method of any of paragraphs B1-B15.1.2, wherein importing the first data array and the second data array into the quantum circuit comprises normalizing and/or converting the first data array and the second data array to positive values prior to importing them into the quantum computer.

B17. The method of any of paragraphs B1-B16, further comprising generating an image based at least in part on the first data array, the second data array, and the cross-correlation values from the quantum circuit.

B18. The method of any of paragraphs B1-B17, further comprising determining a pattern between the first data array and the second data array based on the cross-correlation values.

B18.1. The method of paragraph B18, wherein determining the pattern comprises determining a shift between the first data array and the second data array.

B18.1.1. The method of paragraph B18.1, wherein determining the pattern comprises determining a shift vector for the first data array and the second data array.

B18.1.2. The method of paragraph B18.1, wherein determining the pattern comprises determining a limited number of shift vectors for the first data array and the second data array.

B19. The method of any of paragraphs B1-B18.1, wherein the first data array corresponds to first image data, and the second data array corresponds to second image data.

B19.1. The method of paragraph B19, wherein the first image data and the second image data image data are generated at least in part using an ion beam/electron microscope.

B19.1.1. The method of paragraph B19.1, further comprising receiving the first image data and the second image data image data by the computing device and from a computing device associated with the ion beam/electron microscope over a network connection.

B19.2. The method of any of paragraphs B19-B19.1.1, wherein the first image data and the second data are generated in association with a sample.

B19.3. The method of any of paragraphs B19-B19.2, wherein the first image data is generated at a first time, and the second image data is generated at a second time.

B19.4. The method of any of paragraphs B19-B19.3, wherein importing the first image data into the quantum circuit comprises storing the individual pixel values of the first image data as a probability of the corresponding position state.

C1. A method for computing less noisy image based of two images using a quantum processing system, the method comprising:
importing an image data array into a quantum circuit, wherein the quantum circuit comprises:
a first set of qubits configured to store a template image data array;
a second set of qubits configured to receive the data image array;
a third set of qubits configured to receive the data image array; and
a fourth set of qubits where a new data image value is to be written;
implementing a quantum amplitude estimation between: the first set of qubits, the second set of qubits, and third set of qubits; and the fourth set of qubits; and
determining, based at least in part on the new image data value in the fourth set of qubits, a new value in EMML for the image data array; and
generating the less noisy data image based at least in part on the image data array and the new value in EMML for the image data array.

C1.1. The method of paragraph C1, wherein the image data array is generated based on sensor data detected by one or more sensors.

C1.2. The method of any of paragraphs C1-C1.1, wherein the image data array is generated at least in part using an ion beam/electron microscope.

C1.2.1. The method of paragraph C1.2, further comprising receiving the image data array data from a computing device associated with the ion beam/electron microscope over a network connection.

C1.3. The method of any of paragraphs C1.1-C1.2.1, wherein the image data array is generated in association with a sample.

C1.4. The method of any of paragraphs C1-C1.3, wherein the image data array corresponds to pixel values for the image.

C2. The method of any of paragraphs C1-C1.4, wherein the image data array is part of a set of image data arrays.

C2.1. The method of paragraph C2, wherein the template array comprises a set of values that are given by an average of the data of the set of image data arrays.

C2.1.1. The method of paragraph C2.1, wherein the set of values correspond to $\{X_{j,k}^n\}$, where j and k are pixel coordinates, and n refers to the number of iteration.

C2.1.1.1. The method of paragraph C2.1.1, wherein $\{X_{j,k}^n\}$ is equal to:

$$x_{j,k}^{n+1} = \sum_{\bar{J},\bar{k}=0}^{N-1} C_{\bar{J},\bar{k}}^n x_{j\oplus \bar{J}, k\oplus \bar{k}}^n;$$

where $C_{\bar{J},\bar{k}}^n = \sum_{j',k'=0}^{N-1} X_{j',k'}^n x_{j'\oplus \bar{J}, k'\oplus \bar{k}}^n.$ C2.2. The method of any of paragraphs C2-C2.1.1.1, wherein each image data array within the set of image data arrays corresponds to an image of a sample taken at a corresponding time.

C3. The method of any of paragraphs C1-C2.2, wherein the first set of qubits, the second set of qubits, and the third set of qubits are each composed of 2 log N qubits.

C4. The method of any of paragraphs C1-C3, wherein the dimension of the fourth set of qubits is Log M qubits, where M corresponds to number of digits of precision with which the new data value is calculated.

C5. The method of any of paragraphs C1-C4, wherein importing the image data array into the quantum circuit comprises implementing an encoding gate that implements an encoding operation that imports the image data array into the second set of qubits.

C6. The method of any of paragraphs C1-C5, wherein importing the image data array into the quantum circuit comprises implementing an/the encoding gate that implements an/the encoding operation that imports the image data array into the third set of qubits.

C7. The method of any of paragraphs C5-C6, wherein the encoding gate is $A_I$.

C7.1. The method of paragraph C7, wherein $A_I$ corresponds to:

$$A_I |0\rangle^{\otimes 2\log N} = \sum_{j,k=0}^{N-1} \sqrt{x_{j,k}^n} |j, k\rangle$$

C8. The method of any of paragraphs C1-C7, wherein importing the image data array into the quantum circuit comprises implementing a template encoding gate that implements a template encoding operation that imports the template image data array into the first set of qubits.

C8.1. The method of paragraph C8, wherein the template encoding gate is $A_T$.

C8.1.1. The method of paragraph C8.1, wherein $A_T$ corresponds to:

$$A_T |0\rangle^{\otimes 2\log N} = \Sigma_{j,k=0}^{N-1} \sqrt{\overline{X_{j,k}^n}} |j,k\rangle.$$

C8.1.1.1. The method of paragraph C8.1.1, wherein $A = A_T \otimes A_I \otimes (S_{j,k} A_I)$.

C9. The method of paragraphs C1-C8.1.1, wherein, after the data is imported into the quantum circuit, the state of the first set of qubits, the second set of qubits, and third set of qubits is:

$$\sum_{j'',k''=0}^{N-1} \sqrt{X_{j'',k''}^n} |j'', k''\rangle_{templ} \otimes \sum_{j',k'=0}^{N-1} \sqrt{x_{j',k'}^n} |j', k'\rangle_{C1} \otimes$$

$$\sum_{\bar{J},\bar{k}=0}^{N-1} \sqrt{x_{\bar{J},\bar{k}}^n} |\bar{J}, \bar{k}\rangle_{C2} \otimes |0\rangle_{new}^{\otimes \log M}$$

C10. The method of paragraphs C1-C9, further comprising applying a difference gate that implements a difference operation to the third set of qubits.

C10.1. The method of paragraph C10, wherein the difference gate is $S_{j,k}$.

C10.1.1. The method of paragraph C10.1, wherein $S_{j,k}$ implements the difference operation:

$$\sum_{\vec{j},\vec{k}=0}^{N-1} \sqrt{x_{\vec{j},\vec{k}}^n} |\vec{j},\vec{k}\rangle \xrightarrow{yields} \sum_{\vec{j},\vec{k}=0}^{N-1} \sqrt{x_{\vec{j},\vec{k}}^n} |\vec{j}\ominus j,\vec{k}\ominus k\rangle,$$

where $\ominus$ is the difference in the base N.

C10.2. The method of paragraphs C10-C10.1.1, wherein the state of the first set of qubits, the second set of qubits, and third set of qubits after the difference operation is applied to the third set of qubits is:

$$\sum_{j'',k''=0}^{N-1} \sqrt{X_{j'',k''}^n} |j'',k''\rangle_{templ} \otimes \sum_{j',k'=0}^{N-1} \sqrt{x_{j',k'}^n} |j',k'\rangle_{C1} \otimes$$

$$\sum_{\vec{j},\vec{k}=0}^{N-1} \sqrt{x_{j\oplus\vec{j},k\oplus\vec{k}}^n} |\vec{j},\vec{k}\rangle_{C2} \otimes |0\rangle_{new}^{\otimes \log M}.$$

C11. The method of any of paragraphs C1-C10.2, further comprising initializing the fourth set of qubits.

C11.1. The method of paragraph C11, wherein initializing the fourth set of qubits comprises applying a $H^{\otimes \log M}$ gate to the fourth set of qubits.

C11.1.1. The method of paragraph C11.1, wherein the H is a Hadamard operator.

C12. The method of any of paragraphs C1-C11.1.1, wherein implementing a quantum amplitude estimation comprises applying a quantum Fourier transform (QFT) over the fourth set of qubits.

C12.1. The method of paragraph C12, wherein implementing a quantum amplitude estimation further comprises applying a controlled $G^M \Gamma_M(G)$ to the first set of qubits, the second set of qubits, the third set of qubits, and the fourth set of qubits.

C12.1.1. The method of paragraph C12.1, wherein the quantum operator $\Gamma_M(G)$ is defined as:

$$\Gamma_M(G)|y\rangle_{templ,C1,C2}|m\rangle_{new} = G^M|y\rangle_{temple,C1,C2}|m\rangle_{new}.$$

C13. The method of any of paragraphs C1-C12.1, wherein implementing a quantum amplitude estimation further comprises applying an inverse quantum Fourier transform (QFT) over the fourth set of qubits.

C13.1. The method of paragraph C13, wherein the cross-correlation values in the fourth quantum register after the controlled $Q^M \Lambda_M(Q)$ and an inverse quantum Fourier transform are applied are $\theta_j$.

C14. The method of any of paragraphs C1-C13.1, wherein determining the new value in EMML for the data array comprises: determining the new data value in the fourth set of qubits; and calculating the new value in EMML using the new data value.

C14.1. The method of paragraph C14, wherein determining the new data value comprises determining the value $\theta_{j,k}$ in the fourth set of qubits.

C14.2. The method of any of paragraphs C14-C14.1, wherein calculating the new value in EMML comprises calculating $$\sin^2 \frac{\pi}{M} \theta_{j,k}.$$

C15. The method of any of paragraphs C1-C14.2, wherein the complexity of the amplitude estimation is upper bounded by O(N).

D1. A method for computing a new data value in expectation-maximization-maximum-likelihood (EMML) using a quantum processing system, the method comprising:
importing a data array into a quantum circuit, wherein the quantum circuit comprises:
a first set of qubits configured to store a template array;
a second set of qubits configured to receive the data array;
a third set of qubits configured to receive the data array; and
a fourth set of qubits where a new data value is to be written;
implementing a quantum amplitude estimation between: the first set of qubits, the second set of qubits, and third set of qubits; and the fourth set of qubits; and
determining, based at least in part on the new data value in the fourth set of qubits, a new value in EMML for the data array; and
generating a less noisy data array based at least in part on the data array and the new value in EMML for the data array.

D1.1. The method of paragraph D1, wherein the data array is generated based on sensor data detected by one or more sensors.

D1.2. The method of any of paragraphs D1-D1.1, wherein the data array is generated at least in part using an ion beam/electron microscope.

D1.2.1. The method of paragraph D1.2, further comprising receiving the data array from a computing device associated with the ion beam/electron microscope over a network connection.

D1.3. The method of any of paragraphs D1.1-D1.2.1, wherein the data array is generated in association with a sample.

D1.4. The method of any of paragraphs D1-D1.3, wherein the data array is an image data array associated with an image.

D1.4.1. The method of paragraph D1.4, wherein the image data array comprises pixel values for the image.

D.2. The method of any of paragraphs D1-D1.4.1, wherein the data array is part of a set of data arrays.

D2.1. The method of paragraph D2, wherein the template array comprises a set of that are given by an average of the data of the set of data arrays.

D2.1.1. The method of paragraph D2.1, wherein the set of values correspond to $\{X_{j,k}^n\}$, where j and k are pixel coordinates, and n refers to the number of iteration.

D2.1.1.1. The method of paragraph D2.1.1, wherein $\{X_{j,k}^n\}$ is equal to:

$$x_{j,k}^{n+1} = \sum_{\vec{j},\vec{k}=0}^{N-1} C_{\vec{j},\vec{k}}^n x_{j\oplus\vec{j},k\oplus\vec{k}}^n;$$

where $C_{\bar{j},\bar{k}}^n = \sum_{j',k'=0}^{N-1} X_{j',k'}^n X_{j'\oplus\bar{j},k'\oplus\bar{k}}^n$.

D2.2. The method of any of paragraphs D2-D2.1.1.1, wherein each data array within the set of data arrays corresponds to an image of a sample taken at a corresponding time.

D3. The method of any of paragraphs D1-D2.2, wherein the first set of qubits, the second set of qubits, and the third set of qubits are each composed of 2 log N qubits.

D4. The method of any of paragraphs D1-D3, wherein the dimension of the fourth set of qubits is Log M qubits, where M corresponds to the number of digits of precision with which the new data value is calculated.

D5. The method of any of paragraphs D1-D4, wherein importing the data array into the quantum circuit comprises implementing an encoding gate that implements an encoding operation that imports the data array into the second set of qubits.

D6. The method of any of paragraphs D1-D5, wherein importing the data array into the quantum circuit comprises implementing an/the encoding gate that implements an/the encoding operation that imports the data array into the third set of qubits.

D7. The method of any of paragraphs D5-D6, wherein the encoding gate is $A_I$.

D7.1. The method of paragraph D7, wherein $A_I$ corresponds to:

$$A_I|0\rangle^{\otimes 2\log N} = \sum_{j,k=0}^{N-1} \sqrt{X_{j,k}^n} |j,k\rangle$$

D8. The method of any of paragraphs D1-D7, wherein importing the data array into the quantum circuit comprises implementing a template encoding gate that implements a template encoding operation that imports the template array into the first set of qubits.

D8.1. The method of paragraph D8, wherein the template encoding gate is $A_T$.

D8.1.1. The method of paragraph D8.1, wherein $A_T$ corresponds to:

$$A_T|0\rangle^{\otimes 2\log N} = \sum_{j,k=0}^{N-1} \sqrt{X_{j,k}^n} |j,k\rangle$$

D8.1.1.1. The method of paragraph D8.1.1, wherein $A = A_T \otimes A_I \otimes (S_{j,k} A_I)$.

D9. The method of paragraphs D1-D8.1.1, wherein, after the data is imported into the quantum circuit, the state of the first set of qubits, the second set of qubits, and third set of qubits is:

$$\sum_{j'',k''=0}^{N-1} \sqrt{X_{j'',k''}^n} |j'',k''\rangle_{templ} \otimes \sum_{j',k'=0}^{N-1} \sqrt{X_{j',k'}^n} |j',k'\rangle_{C1} \otimes$$

$$\sum_{\bar{J},\bar{k}=0}^{N-1} \sqrt{X_{\bar{J},\bar{k}}^n} |\bar{J},\bar{k}\rangle_{C2} \otimes |0\rangle_{new}^{\otimes \log M}$$

D10. The method of paragraphs D1-D9, further comprising applying a difference gate that implements a difference operation to the third set of qubits.

D10.1. The method of paragraph D10, wherein the difference gate is $S_{j,k}$.

D10.1.1. The method of paragraph D10.1, wherein $S_{j,k}$ implements the difference operation:

$$\sum_{\bar{J},\bar{k}=0}^{N-1} \sqrt{x_{\bar{J},\bar{k}}^n} |\bar{J},\bar{k}\rangle \xrightarrow{yields} \sum_{\bar{J},\bar{k}=0}^{N-1} \sqrt{x_{\bar{J},\bar{k}}^n} |\bar{J}\ominus j, \bar{k}\ominus k\rangle,$$

where $\ominus$ is the difference in the base N.

D10.2. The method of paragraphs D10-D10.1.1, wherein the state of the first set of qubits, the second set of qubits, and third set of qubits after the difference operation is applied to the third set of qubits is:

$$\sum_{j'',k''=0}^{N-1} \sqrt{X_{j'',k''}^n} |j'',k''\rangle_{templ} \otimes \sum_{j',k'=0}^{N-1} \sqrt{X_{j',k'}^n} |j',k'\rangle_{C1} \otimes$$

$$\sum_{\bar{J},\bar{k}=0}^{N-1} \sqrt{X_{j\oplus\bar{J},k\oplus\bar{k}}^n} |\bar{J},\bar{k}\rangle_{C2} \otimes |0\rangle_{new}^{\otimes \log M}$$

D11. The method of any of paragraphs D1-D10.2, further comprising initializing the fourth set of qubits.

D11.1. The method of paragraph D11, wherein initializing the fourth set of qubits comprises applying a $H^{\otimes \log M}$ gate to the fourth set of qubits.

D11.1.1. The method of paragraph D11.1, wherein the H is a Hadamard operator.

D12. The method of any of paragraphs D1-D11.1.1, wherein implementing a quantum amplitude estimation comprises applying a quantum Fourier transform (QFT) over the fourth set of qubits.

D12.1. The method of paragraph D12, wherein implementing a quantum amplitude estimation further comprises applying a controlled $G^M \Gamma_M(G)$ to the first set of qubits, the second set of qubits, the third set of qubits, and the fourth set of qubits.

D12.1.1. The method of paragraph D12.1, wherein the quantum operator $\Gamma_M(G)$ is defined as:

$$\Gamma_M(G)|y\rangle_{templ,C1,C2}|m\rangle_{new} = G^M|y\rangle_{templ,C1,C2}|m\rangle_{new}.$$

D13. The method of any of paragraphs D1-D12.1, wherein implementing a quantum amplitude estimation further comprises applying an inverse quantum Fourier transform (QFT) over the fourth set of qubits.

D13.1. The method of paragraph D13, wherein the cross-correlation values in the fourth quantum register after the controlled $Q^M \Lambda_M(Q)$ and an inverse quantum Fourier transform are applied are $\theta_j$.

D14. The method of any of paragraphs D1-D13.1, wherein determining the new value in EMML for the data array comprises:
  determining the new data value in the fourth set of qubits; and
  calculating the new value in EMML using the new data value.

D14.1. The method of paragraph D14, wherein determining the new data value comprises determining the value $\theta_{j,k}$ in the fourth set of qubits.

D14.2. The method of any of paragraphs D14-D14.1, wherein calculating the new value in EMML comprises calculating $$\sin^2 \frac{\pi}{M} \theta_{j,k}.$$

D15. The method of any of paragraphs D1-D14.2, wherein the complexity of the amplitude estimation is upper bounded by O(N).

E1. A quantum computing system comprising:
a quantum computing device comprising a plurality of qubits; and
a computing device comprising:
  one or more processing units; and
  a memory storing computer readable instructions that, when executed by the one or more processing units cause the computing device to perform the method of any of paragraphs A1-A19.1, B1-B19.4, C1-C15, and D1-D15.

F1. A computing device comprising:
one or more processing units; and
a memory storing computer readable instructions, that when executed on the one or more processing units cause the computing device to perform the method of any of paragraphs A1-A19.1, B1-B19.4, C1-C15, and D1-D15.

G1. Computer readable media storing non-transitory computer readable instructions that, when executed by one or more processing units cause a computing device to perform the method of any of paragraphs A1-A19.1, B1-B19.4, C1-C15, and D1-D15.

What is claimed is:

1. A quantum computing system comprising:
a quantum computing device comprising a plurality of qubits; and
a computing device comprising:
  one or more processing units; and
  a memory storing computer readable instructions that, when executed by the one or more processing units cause the computing device to:
import a first data array and a second data array into a quantum circuit, wherein the quantum circuit comprises:
  a first set of qubits configured to receive the first data array;
  a second set of qubits configured to receive the second data array;
  a third set of qubits configured to store shift values; and
  a fourth set of qubits where cross-correlation values for the first data array and the second data array are calculated;
implement a quantum amplitude estimation between: the first set of qubits, the second set of qubits, and the third set of qubits; and the fourth set of qubits;
export the cross-correlation values from the quantum circuit based on a result of the quantum amplitude estimation; and
calculate a cross-correlation between the first and second data arrays based on the exported cross-correlation values.

2. The quantum computing system of claim 1, wherein the first data array corresponds to first image data, and the second data array corresponds to second image data, and the instructions are executable to cause the one or more processing units to generate a new image based on the first image data, the second image data, and the cross-correlation values.

3. The quantum computing system of claim 2, wherein the first image data and the second image data image data are generated at least in part using at last one of an ion beam microscope, an optic microscope, an electron microscope, or a charged particle microscope.

4. The quantum computing system of claim 1, wherein exporting the cross-correlation values comprises exporting a value $\theta_j$ from the fourth set of qubits, and calculating the cross correlation based on the value of $\theta_j$.

5. A method for determining a cross-correlation of two data arrays using a quantum processing system, the method comprising:
importing a first data array and a second data array into a quantum circuit, wherein the quantum circuit comprises:
  a first set of qubits configured to receive the first data array;
  a second set of qubits configured to receive the second data array;
  a third set of qubits configured to store shift values; and
  a fourth set of qubits where the cross-correlation values for the first data array and the second data array are calculated;
implementing a quantum amplitude estimation between: the first set of qubits, the second set of qubits, and the third set of qubits; and the fourth set of qubits;
exporting the cross-correlation values from the quantum circuit based on a result of the quantum amplitude estimation; and
calculating a cross-correlation between the first and second data arrays based on the exported cross-correlation values.

6. The method of claim 5, wherein each of the first set of qubits and the second set of qubits are of dimension Log N qubits, where N corresponds to a number of elements of each of the first and second data arrays.

7. The method of claim 5, wherein exporting the cross-correlation values comprises exporting a value $\theta_j$ from the fourth set of qubits, and calculating the cross correlation based on the value of $\theta_j$.

8. The method of claim 5, wherein the third set of qubits is of dimension Log N qubits, where N corresponds to a number of elements of each of the first and second data arrays.

9. The method of claim 5, wherein the fourth register is of a dimension of qubits that corresponds to a number of digits of precision with which an amplitude of the cross-correlation values are calculated.

10. The method of claim 5, wherein importing the second data array into the quantum circuit comprises importing the second data array into the second set of qubits using a quantum encoding operator.

11. The method of claim 10, wherein the second data array is imported into the second set of qubits as:

$$\Sigma_{j'=0}^{N-1} \sqrt{x_{j'}^B} |j'\rangle,$$

where N corresponds to a number of elements of each of the first and second data arrays, and where $x_j^B$ is the j'th element of the second data array.

12. The method of claim 5, wherein the method further comprises applying a controlled Grover operator to the quantum circuit, where the Grover operator corresponds to: $Q=AS_0A^{-1}S_x$, where A is an encoding operator, and where $S_0$ and $S_x$ are phase operators.

13. The method of claim 5, further comprising initializing the third set of qubits by applying a $H^{\otimes \log N}$ gate to the third set of qubits, where the H is a Hadamard operator, where N corresponds to a number of elements of each of the first and second data arrays.

14. The method of claim 5, wherein implementing the quantum amplitude estimation comprises applying a quantum Fourier transform (QFT) over the fourth set of qubits.

15. The method of claim 5, further comprising generating an image based at least in part on the first data array, the second data array, and the cross-correlation values from the quantum circuit.

16. The method of claim 5, further comprising determining a shift between the first data array and the second data array based on the cross-correlation values.

17. The method of claim 5, wherein the first data array corresponds to first image data, and the second data array corresponds to second image data, and the method further comprises generating a new image based on the first image data, the second image data, and the cross-correlation values.

18. The method of claim 17, wherein the first image data and the second image data image data are generated at least in part using an ion beam/electron microscope.

19. The method of claim 17, wherein importing the first image data into the quantum circuit comprises storing an individual pixel values of the first image data as a probability of a corresponding position state.

* * * * *